United States Patent
Kondo et al.

(10) Patent No.: US 6,504,903 B1
(45) Date of Patent: Jan. 7, 2003

(54) LASER-EXCITED PLASMA LIGHT SOURCE, EXPOSURE APPARATUS AND ITS MAKING METHOD, AND DEVICE MANUFACTURING METHOD

(75) Inventors: Hiroyuki Kondo, Kawasaki (JP); Noriaki Kandaka, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/722,817

(22) Filed: Nov. 28, 2000

Related U.S. Application Data

(63) Continuation of application No. PCT/JP99/02878, filed on May 31, 1999.

(30) Foreign Application Priority Data

May 29, 1998 (JP) .......................................... 10-166318
Sep. 14, 1998 (JP) .......................................... 10-259059

(51) Int. Cl.[7] ........................................... H01L 21/027
(52) U.S. Cl. ........................................ 378/119; 378/145
(58) Field of Search .............................. 378/34, 35, 84, 378/85, 145, 119

(56) References Cited

U.S. PATENT DOCUMENTS 5,867,269 A * 2/1999 Albers et al. ............... 356/350
6,011,267 A * 1/2000 Kubiak et al. .............. 250/423

FOREIGN PATENT DOCUMENTS

| EP | 0 858 249 | | 8/1998 |
|---|---|---|---|
| JP | 63-138739 A | * | 6/1988 |
| JP | 8-17371 | | 1/1996 |
| JP | 10-31099 | | 2/1998 |
| JP | 10-208998 | | 8/1998 |
| JP | 10-221499 | | 8/1998 |

* cited by examiner

Primary Examiner—David P. Porta
(74) Attorney, Agent, or Firm—Oblon, Spivak, McClelland, Maier & Neustadt, P.C.

(57) ABSTRACT

The end of a nozzle of a laser-excited plasma light source is made of a specific material, such as silicon Si, the transmittance of which to EUV light is higher than those of heavy metals. Therefore, even if the temperature of the end of the nozzle is higher than the melting point of the specific material because of the high temperature of the plasma produced around the focal point, the end of the nozzle is therefore eroded, and sputtered particles of the material adhere to a light-collecting mirror provided near the nozzle, the degradation of the reflectance of the light-collecting mirror is mitigated compared to the transmittance of the sputtered particles (specific material) to EUV light is higher than those of heavy metals.

29 Claims, 10 Drawing Sheets

LASER-EXCITED PLASMA LIGHT SOURCE, EXPOSURE APPARATUS AND ITS MAKING METHOD, AND DEVICE MANUFACTURING METHOD

CROSS-REFERENCE TO RELATED APPLICATIONS

This is a continuation of International Application PCT/JP99/02878, with an international filing date of May 31, 1999, the entire content of which being hereby incorporated herein by reference.

BACKGROUND OF THE INVENTION

1. Field of the Invention

The present invention relates to a laser-excited plasma light source, and an exposure apparatus. More particularly, the present invention relates to a laser-excited plasma light source which generates an energy beam by irradiating an energy-ray generating material released from a nozzle with a laser beam to excite the energy-ray generating material to a plasma state, an exposure apparatus incorporating the laser-excited plasma light source and its making method, and a device manufacturing method for manufacturing micro-devices such as semiconductor devices using the exposure apparatus.

2. Description of the Related Art

EUV (Extreme Ultraviolet) exposure apparatus using EUV light having an wavelength within a range from 5 nm to 20 nm, for instance, 13 nm or 11 nm, as an exposure light, is currently being developed for use in a lithographic process for manufacturing semiconductor devices, as a generation after the next exposure apparatus which transfers, to a substrate (a wafer), a circuit pattern having a practical minimum line width (device rule) of 100 nm to 70 nm. Proposed as a first candidate for the exposure light source of the EUV exposure apparatus is a laser-excited plasma light source.

In conventional laser-excited plasma light sources chiefly employed, EUV light radiating material such as a copper tape is used as an energy-ray generating material (hereinafter referred to as a "target" as appropriate). And, a high-energy laser beam is condensed and directed onto the target to excite it to a plasma state to generate an energy beam such as an EUV light beam. Since, in spite of its compact size, the laser-excited plasma light source provides luminance as bright as that by undulators, the laser-excited plasma light source currently attracts attention as a light source for X-ray equipment such as an X-ray analysis apparatus or an X-ray exposure apparatus.

In the laser-excited plasma light source, besides energy beams, resulting from the destruction of the materials forming the target on which the plasma and the laser beam are converged, ions, atoms, and microscopic fragments are released. These sputtered particles, so-called debris, are stuck onto or deposited onto optical elements arranged close to the plasma (including a lens for condensing a laser beam, a collecting mirror for reflecting an energy beam generated from the plasma, i.e., an X ray, and a filter for transmitting the X ray generated from the plasma while cutting off visible light), thereby reducing the performance of the optical elements (reflectance and transmittance). The reduction of the sputtered particles is thus a major concern in the utilization of the laser-excited plasma light source.

To substantially reduce the sputtered particles, a gas cluster jet laser-excited plasma light source has been proposed (U.S. Pat. No. 5,577,092), in which a material (a high-density gas), remaining in a gaseous state at normal temperature, for instance, xenon (Xe), krypton (Kr), nitrogen, or carbon dioxide, is used and released through a nozzle, as a target, and the jet of this target gas or cluster is irradiated with a laser beam. Since the target remains gaseous at normal temperature, the target is not deposited in debris on the optical elements, and the performance of the optical elements is thus free from degradation.

The laser-excited plasma light source does not need a high level of vacuum (as high as $10^{-9}$ Torr ($10^{-7}$ Pa) or so), and the vacuum level is sufficient if the laser beam does not perform gaseous release in residual gas prior to reaching the target and if the energy beam generated from the plasma is free from high absorption prior to reaching an object to be irradiated. Specifically, a vacuum of several tens of Torr to 0.1 Torr (8,000 Pa–10 Pa) is acceptable. For this reason, a low-cost evacuator, such as a rotary pump, works, and is thus reasonable for use.

In the gas cluster jet laser-excited plasma light source referenced above, the jet of the gas from the nozzle freely expands in the vacuum, and the density of the gas rapidly drops as the gas distances from the nozzle. To increase the dose of the energy beam from the plasma, the plasma has to be generated close to the nozzle (within a distance of several tenths mm to several mm) where the density of the gas (cluster) is still high. When the plasma is generated close to the nozzle, fast atoms, ions and electrons emitted from the plasma collide with nearby components, and erode these components. Atomic or fragmental debris eroded from the nozzle and components peripheral to the nozzle (hereinafter referred to as sputtered particles) scatter in all directions, and are adhered and deposited on the optical elements arranged close to the plasma, causing a drop in the performance of the optical elements.

To increase an energy conversion efficiency from the laser beam to the energy beam such as an X ray in the gas cluster jet laser-excited plasma light source, the plasma has to be located somewhat closer to the nozzle. But locating the plasma close to the nozzle increases sputtered particles from the nozzle and the components close to the nozzle. This method in the laser-excited plasma light source cannot satisfy the two requirements at the same time, namely the improvement in the energy conversion efficiency and the reduction in the sputtered particles.

Also, according to recent studies, even with a minimum distance of several mm between the laser converging point and the end of the nozzle, the plasma becomes extremely hot and erodes and damages the spout at the end of the nozzle, scattering heavy metal which constitutes the end of the nozzle. It then becomes some sort of debris, and the debris is deposited on the collecting mirror, degrading the reflectance of the collecting mirror.

Presumably, the same phenomenon takes place in the laser-excited plasma light source disclosed in U.S. Pat. No. 5,577,091 and U.S. Pat. No. 5,459,771, in which ice crystals and snow flakes are used as a target.

Although it is a small amount, oil used in the rotary pump is reversed to the vacuum system, and is adhered and deposited on the optical elements during long time of use, thereby gradually decreasing the performance of the optical elements (i.e., reflectance, transmittance, and diffraction efficiency) in time. To cope with this problem, the apparatus needed to be disassembled to replace an affected optical element with a new one, or an affected optical element had to be cleaned and put back in place.

In an EUV exposure apparatus using the above-referenced gas cluster jet laser-excited plasma light source, the life of a collecting mirror is shortened by the generation of debris or the reverse flow of the oil, and a maintenance job, such as the replacement of the collecting mirror, has to be frequently performed. For each maintenance job, the apparatus needs to be stopped.

SUMMARY OF THE INVENTION

The present invention has been developed in view of the above problems, and it is a first object of the present invention to provide a laser-excited plasma light source which reduces a drop in the reflectance of a collecting mirror due to the generation of debris.

A second object of the present invention is to provide an exposure apparatus which reduces the frequency of maintenance jobs, such as the replacement of the collecting mirror, and improves the production yield of devices.

The present invention in a first aspect lies in a first laser-excited plasma light source which generates energy beams by irradiating an energy-ray generating material with a laser beam to excite the energy-ray generating material to a plasma state, the light source comprising: a nozzle which releases the energy-ray generating material, and at least a surface layer of an end portion of the nozzle is formed of a material including a specific material, the specific material having a transmittance larger than that of a heavy metal to an energy beam which has a wavelength to be utilized, the energy beam being among the generated beams; and a laser light source which irradiates the energy-ray generating material released through the nozzle with the laser beam.

In this description, "materials including a specific material" collectively refer to a specific material, a compound or a mixture, which includes the specific material as a principal constituent.

In this arrangement, the energy-ray generating material is excited to a plasma state and the energy beam is generated, when the energy-ray generating material is released through the nozzle, and is then irradiated with the laser beam. When the energy beam is generated, at least the surface layer of the end of the nozzle is eroded by the high temperature of the plasma, or by the collision of atoms, ions, and electrons created from the plasma. At least the surface layer of the end of the nozzle is formed of the materials including the specific material having the transmittance, higher than those of the heavy materials, to the energy beam in use. The temperature of the end of the nozzle may become higher than the melting point of the specific material because of the high temperature of the plasma. Even if the end of the nozzle is eroded, and the sputtered particles are deposited on the nearby collecting mirror, the rate of reduction in the reflectance of the collecting mirror is reduced in comparison with the case in which a conventional heavy metal nozzle is employed, because the transmittance of the sputtered particles (containing specific material) to the energy beam is higher than that of the heavy metal.

In the first laser-excited plasma light source of the present invention, the energy beam to be utilized may be EUV (Extreme Ultraviolet) light having a wavelength within a range from 5 nm to 50 nm. In this case, the specific material is preferably one of silicon (Si) and beryllium (Be). Silicon has a transmittance higher than those of heavy materials, to the EUV light as an energy beam, and a thickness of 0.5 $\mu$m of silicon layer transmits the EUV light at a transmittance of 50% or so, and beryllium has a transmittance as high as or higher than that of silicon. Even if these elements become sputtered particles and are deposited on the collecting mirror, a drop in the reflectance thereof due to the deposits remains small.

In the first laser-excited plasma light source of the present invention, the end portion of the nozzle is formed of only the specific material, or alternatively, the surface layer of the end portion of the nozzle may be formed of a coating layer of the specific material deposited on a surface of a base member. In the latter case, the base is preferably formed of a metal, such as iron (Fe), titanium (Ti), tungsten (W), or an alloy, or carbon, and is more preferably formed of a high-melting point metal such as tungsten (W) or carbon. Since these metals are easier to process than silicon, the manufacturing of the nozzle is easy, and tungsten (W) has an excellent heat resistance.

In the first laser-excited plasma light source of the present invention, water or ice may be employed as the energy-ray generating material, and the energy-ray generating material may be one of a gas and clusters. The use of these materials as an energy-ray generating material substantially reduces the sputtered particles. A xenon gas may also be employed as an energy-ray generating material.

In the first laser-excited plasma light source of the present invention, a vacuum chamber that encloses the nozzle and members peripheral to the nozzle may be included. This arrangement not only reduces a reduction in the reflectance of the optical elements close to the nozzle, but also reliably prevents the above-mentioned sputtered particles from depositing on the collecting mirror arranged external to the vacuum chamber. In this case, at least the surface layer of the nozzle and at least a surface layer of at least one of the peripheral members may be formed of materials including the specific material. Since, the surface of the peripheral members is subject to an erosion (is subject to an abrasion) as a result of the high temperature of the plasma and the collision of atoms, ions, and electrons created from the plasma like the surface layer of the nozzle end portion, the reduction in the reflectance is controlled when the sputtered particles are deposited onto the collecting mirror.

When the vacuum chamber that encloses the nozzle and members peripheral to the nozzle is included, the first laser-excited plasma light source of the present invention may further include at least one multilayer film mirror which has a multilayer film formed on its reflective surface, and is arranged as one of a portion of the vacuum chamber and inside the vacuum chamber, wherein the specific material can be a material selected from among materials employed for the multilayer film which has a high transmittance to the energy beam.

A multilayer film, formed on the mirror reflective surface on which an energy beam having a short wavelength, for instance, a n X ray, is radiated from the laser-excited plasma light source, is formed of a combination of a material having a high complex index of refraction and a material having a high transmittance at a reflected wavelength. Considering this point in the present invention, the specific material, namely, a chief constituent of the materials forming at least the surface layer of the nozzle end portion and the peripheral members, subject to erosion as a result of the high temperature of the plasma and the collision of atoms, ions, and electrons created from the plasma against the layer, is a material selected from among materials employed for the multilayer film which has a high transmittance to the energy beam.

Specifically, even if the materials, including such a specific material, become the sputtered particles, and are deposited on the multilayer film mirrors including the collecting mirror, the drop in the reflectance of the multilayer film mirror such as the collecting mirror is marginal and a drop in the output intensity of the energy beam also remains marginal, because most of the components of the sputtered particles is the original constituent forming the multilayer film.

When the vacuum chamber includes a plurality of optical elements, such as the multilayer film mirror, and thin-film materials are different from optical element to optical element, it is preferred to use a thin-film material having the highest transmittance to the energy beam having a wavelength in use and being appropriate as a material for the nozzle and the members peripheral to the nozzle.

In this case, the multilayer film mirror may be an optical element on which the energy beam generated from the plasma is first incident (for convenience, referred to as a "first optical element"). The first optical element is most subject to the influence of the sputtered particles. In accordance with the present invention, the drop in the reflectance of the first optical element is controlled in the way discussed above, and the drop in the output strength of the energy beam is consequently controlled.

The present invention in a second aspect lies in a second laser-excited plasma light source which generates an energy beam by irradiating an energy-ray generating material with a laser beam to excite the energy-ray generating material to a plasma state, the light source comprising: a nozzle which releases the energy-ray generating material; a vacuum chamber which encloses the nozzle and members peripheral to the nozzle; and a laser light source which irradiates the energy-ray generating material being released through the nozzle, with the laser beam, wherein the energy beam is an X-ray, and at least a surface layer of an end of the nozzle and the peripheral members is formed of a material including at least one material selected from a group consisting of beryllium (Be), boron (B), silicon (Si), phosphorus (P), sulfur (S), chlorine (Cl), argon (Ar), krypton (Kr), rubidium (Rb), strontium (Sr), yttrium (Y), zirconium (Zr), niobium (Nb), ruthenium (Ru), rhodium (Rh), palladium (Pd), and silver (Ag).

In the laser-excited plasma light source in which the energy beam to be utilized is an X ray, krypton (Kr) and xenon (Xe) are frequently used as the energy-ray generating material (hereinafter referred to as a "target" as appropriate). The above-mentioned material, such as beryllium (Be), has a high transmittance to an X ray (more precisely, EUV light within the soft X-ray region) in a wavelength range from 10 to 13 nm when krypton (Kr) or xenon (Xe) is used as an energy-ray generating material. As in the second laser-excited plasma light source, the drop in the reflectance when the sputtered particles are deposited on the collecting mirror is controlled by forming, of materials including beryllium (Be) or the like, at least the surface layer of the nozzle end portion and the peripheral members thereof, subject to the erosion as a result of the high temperature of the plasma and the collision of atoms, ions, and electrons created from the plasma against the layer.

The present invention in a third aspect lies in a third laser-excited plasma light source which generates an energy beam by irradiating an energy-ray generating material with a laser beam to excite the energy-ray generating material to a plasma state, the light source comprising: a nozzle which releases the energy-ray generating material; a vacuum chamber which encloses the nozzle and members peripheral to the nozzle; a laser light source which irradiates the energy-ray generating material being released through the nozzle, with the laser beam; at least one optical element arranged as one of a portion of the vacuum chamber and inside the vacuum chamber; a first mechanism which irradiates at least one of the optical elements with light having a wavelength not longer than 400 nm; a second mechanism which introduces a gas containing at least one of oxygen and ozone, at least close to the optical element irradiated with the light within the vacuum chamber, wherein among the nozzle and the peripheral members, at least a surface layer of an end portion of the nozzle is formed of materials including carbon.

Light rays of 400 nm or shorter include ultraviolet light, vacuum ultraviolet light and light having a wavelength shorter than the wavelengths of these. The "gas containing at least one of oxygen and ozone" may be a gas containing oxygen, a gas containing ozone, a gas containing both oxygen and ozone, oxygen itself, or ozone itself. The "materials including carbon" may be a compound or a mixture having carbon as the chief constituent thereof, or carbon itself.

In accordance with the present invention, the energy-ray generating material is released through the nozzle. When the released energy-ray generating material is irradiated with the laser beam, the energy-ray generating material is excited to a plasma state, generating an energy beam. When the energy beam is generated, the surface layer of the end of the nozzle is eroded by the high temperature of the plasma, or the collision of atoms, ions, and electrons created from the plasma against the layer, and the sputtered particles are deposited on the collecting mirror and other optical elements in the vacuum chamber. The first mechanism irradiates at least one of the optical elements arranged as a portion of or within the vacuum chamber (specifically, an optical element from which the sputtered particles need to be removed), with light having a wavelength not longer than 400 nm, and the second mechanism introduces the gas containing at least one of oxygen and ozone, at least close to the optical element irradiated with the light within the vacuum chamber.

Since in this case, the surface layer of the nozzle end portion most subject to erosion by the high temperature of the plasma or the collision of the atoms, ions, and electrons created from the plasma against the layer, is formed of the materials containing carbon, the sputtered particles are also made of the materials containing carbon. For this reason, the first mechanism irradiates, with the light having a wavelength not longer than 400 nm, the optical element from which the sputtered particles need to be removed and the second mechanism introduces the gas containing at least one of oxygen and ozone close to the optical element or entirely within the vacuum chamber. Carbon in the sputtered particles stuck onto the surface of the optical element reacts with oxygen or ozone, becoming carbon monoxide (CO) or carbon dioxide ($CO_2$), and thereby removing the sputtered particles. The reason why the light having the wavelength not longer than 400 nm is to facilitate the reaction of oxygen through radical formation, or to break a chemical bond by imparting energy to a chemical bond in the sputtered particles. For this reason, this arrangement is particularly effective when the sputtered particles contain an organic compound or when oil or the like, reversely circulated from a vacuum pump, is deposited on the optical element. In this case, carbon or hydrogen with the chemical bond broken reacts with radical oxygen or ozone, becoming carbon monoxide (CO), carbon dioxide ($CO_2$), water ($H_2O$), and thereby being removed from the optical element. The third laser-excited plasma light source of the present invention can restore the strength of the energy beam within a short period of time, without the need for the disassembling of the apparatus for the replacement or cleaning of the optical element.

In the third laser-excited plasma light source of the present invention, the second mechanism may adjust a pressure interior of the vacuum chamber within a range of several hundredths of Torr to several tens of Torr (1 Pa–8,000 Pa) when the gas is introduced. When the energy beam having the required wavelength is an X ray (EUV light) within a wavelength range from 5 to 15 nm, from among the energy beams generated from the plasma, the attenuation of the X ray is sufficiently small in the vacuum chamber having the pressure of this level, and the attenuation of light (ultraviolet light) having the wavelength not longer than 400 nm is sufficiently small, and the ultraviolet light having a sufficient strength reaches the optical element from which the sputtered particles need to be removed. Furthermore, a sufficient amount of oxygen molecules (or ozone generated from oxygen by ultraviolet light) which may react with the carbon contained in the deposited sputtered particles is present close to the surface of the optical element. Since the attenuation of the energy beam having the required wavelength is sufficiently small, the irradiation with the laser beam can be quickly resumed even if the irradiation with the laser beam from a laser light source is once suspended to remove the deposit on the surface of the optical element.

In the third laser-excited plasma light source of the present invention, the first mechanism is preferably arranged so it can irradiate the optical element with the light without blocking off an outgoing energy beam radiated from the plasma which proceeds out of the vacuum chamber, the outgoing energy beam being the energy beam. With this arrangement, the deposit on the surface of the optical element is removed without the need for the suspension of the irradiation with the laser beam from the laser light source, and the collecting mirror maintains the reflectance thereof for a long period of time, and an extremely long-time continuous operation thus becomes possible.

In the third laser-excited plasma light source of the present invention, the second mechanism can have a cover which is detachably engaged with the optical element irradiated with the light by the first mechanism and substantially seals an interior of the cover, the second mechanism introducing the gas into the interior of the cover. In the second mechanism, the cover is attached to the optical element, irradiated with the light by the first mechanism and the gas containing at least one of oxygen and ozone is supplied into the internal space of the cover only. Since the cover substantially seals the interior, the gas is prevented from leaking out into the vacuum chamber external to the cover, and the light from the first mechanism is not absorbed by oxygen outside the cover. Stronger light thus reaches the optical element. Since the pressure inside the cover can be set to be higher than the pressure within the vacuum chamber without the cover, the removal of carbon-based deposits stuck on the optical element is performed within a shorter duration of time.

In the third laser-excited plasma light source of the present invention, the optical element irradiated with the light by the first mechanism may be an optical element on which the energy beam radiated from the plasma is first incident. As already discussed, the first optical element is most subject to the influence of the sputtered particles. In accordance with the present invention, for the reason described above, the sputtered particle deposits stuck on the first optical element are decomposed and removed, and the drop in the strength of the energy beam is efficiently avoided.

In the third laser-excited plasma light source of the present invention, the materials containing carbon may be one of diamond and an organic compound. In such a case, the surface layer of the nozzle end portion, most likely to be abraded by the atoms, ions, and electrons released from the plasma, is formed of carbon only, and is formed of diamond, which is one of the hardest substances, or the high-hardness organic compound. The rate of abrasion of the nozzle end portion is thus extremely small, and the amount of the sputtered particles is also extremely small. Even if the sputtered particles are deposited on the optical element, carbon stuck on and deposited on the optical element is easily removed by the above means. As the organic compound Kevlar (aromatic species) having a high hardness may be employed. A portion other than the nozzle end portion, and the members peripheral to the nozzle may also be constructed of diamond or the like.

In the third laser-excited plasma light source of the present invention, at least one of the optical elements may be a multilayer film mirror which has a multilayer film formed on its reflective surface, and the materials including carbon are one of a compound and a mixture of carbon and a material selected from among materials used for the multilayer film which has a high transmittance to the energy beam. In this arrangement, the sputtered particles are the compound or the mixture of carbon and the material selected from among materials employed for the multilayer film and having a high transmittance to the energy beam. As already described, carbon is removed when reacting with oxygen. Even if materials other than carbon remain, the materials are the ones employed for the multilayer film and exhibiting a high transmittance to the energy beam having the wavelength in use, and the attenuation of the X ray is small. The multilayer film mirror maintains a sufficient reflectance for a long period of time, and the third laser-excited plasma light source of the present invention can restore the strength of the energy beam within a short period of time, without having to disassemble the apparatus for the replacement or cleaning of the optical element.

The third laser-excited plasma light source of the present invention may further include a heating device which heats the optical element irradiated with the light by the first mechanism. With this arrangement, the reaction of carbon with a gas, such as oxygen, is expedited by heating the optical element irradiated with the ultraviolet light or the like with the heating device.

In the second and third laser-excited plasma light sources of the present invention, water or ice may be employed as the energy-ray generating material, and the energy-ray generating material maybe a gas or clusters. The use of these materials as an energy-ray generating material substantially reduces the sputtered particles.

The present invention in a fourth aspect lies in a fourth laser-excited plasma light source which generates an energy beam by irradiating an energy-ray generating material with a laser beam to excite the energy-ray generating material to a plasma state, the light source comprising: a nozzle which releases the energy-ray generating material; an optical element which reflects the energy beam; wherein at least a surface layer of the nozzle is formed of a specific material employed for a reflective surface of the optical element.

With this arrangement, the energy-ray generating material is released through the nozzle. When the released energy-ray generating material is irradiated with the laser beam, the energy-ray generating material is excited to a plasma state, generating an energy beam. When the energy beam is generated, at least the surface layer of the nozzle, particularly, the surface layer of the end of the nozzle, is eroded by the high temperature of the plasma, or the collision of atoms, ions, and electrons created from the plasma against the layer, and the sputtered particles are deposited on the optical elements which reflect the energy beam. Since at least the surface layer of the nozzle end portion is formed of the specific material employed for the reflective surface of the optical element, the sputtered particles are also formed of the specific material. Even if the sputtered particles are deposited on the optical element, the reflectance of the optical element to the energy beam suffers from almost no drop, and the drop in the output strength of the energy beam becomes marginal.

In the fourth laser-excited plasma light source of the present invention, when the optical element comprises a multilayer film on the reflective surface of the optical element, the specific material is preferably selected from materials employed for the multilayer film. With this arrangement, the specific material selected from materials employed for the multilayer film becomes the sputtered particles, and even if the sputtered particles are deposited on the optical element, the drop in the reflectance of the optical element having the multilayer film on the reflective layer thereof is marginal, because most of the constituents of the sputtered particles are the original constituent forming the multilayer film.

The present invention in a fifth aspect lies in a fifth laser-excited plasma light source which generates an energy beam by irradiating an energy-ray generating material with a laser beam to excite the energy-ray generating material to a plasma state, the light source comprising: a nozzle which releases the energy-ray generating material; a container which houses the nozzle; an optical element arranged as one of a portion of the container and inside the container; and an optical cleaning mechanism which introduces a gas containing at least of one of oxygen and ozone close to at least the optical element within the container, and irradiates the optical element with a cleaning light.

With this arrangement, the energy-ray generating material is released through the nozzle. When the released energy-ray generating material is irradiated with the laser beam, the energy-ray generating material is excited to a plasma state, generating an energy beam. When the energy beam is generated, the surface layer of the end of the nozzle is eroded by the high temperature of the plasma, or the collision of atoms, ions, and electrons created from the plasma against the layer, and the sputtered particles are deposited on the optical elements in the container. The optical cleaning mechanism introduces the gas containing at least of one of oxygen and ozone, at least close to the optical element within the container, and irradiates the optical element with cleaning light. The sputtered particles deposited on the optical element is removed through the cleaning effect of ozone which is generated through photochemical reaction of oxygen contained in the introduced gas with the cleaning light, or of ozone contained in the gas. The energy of the cleaning light breaks the chemical bond in the sputtered particles.

In the fifth laser-excited plasma light source of the present invention, the cleaning light preferably has a wavelength not longer than 400 nm. In this arrangement, the cleaning light with the energy produces oxygen radicals from oxygen to accelerate reaction, or breaks the chemical bond by imparting energy to the chemical bond in the sputtered particles. For this reason, this arrangement is particularly effective when the sputtered particles contain an organic compound or when oil or the like, reversely circulated from a vacuum pump, is deposited on the optical element.

In the fifth laser-excited plasma light source of the present invention, at least a surface layer of the nozzle preferably is formed of materials containing carbon. Since in such a case, the surface layer of the nozzle end portion, most likely to be eroded by the high temperature of the plasma or the collision of the atoms, ions, and electrons created from the plasma against the layer, is formed of the materials containing carbon, the sputtered particles are also formed of the materials containing carbon. For this reason, during the above-mentioned optical cleaning operation, carbon in the sputtered particles deposited on the surface of the optical element reacts with oxygen or ozone, and becomes monoxide (CO) or carbon dioxide ($CO_2$), and the sputtered particles are easily removed.

The present invention in a sixth aspect lies in an exposure apparatus which transfers a pattern formed on a mask onto a substrate while synchronously moving the mask and the substrate, the exposure apparatus comprising: a laser-excited plasma light source according to the present invention; an illumination optical system which illuminates the mask with an energy beam emitted from the laser-excited plasma light source; a mask stage which holds the mask; a projection optical system which projects the energy beam emitted from the mask to the substrate; a substrate stage which holds the substrate; and a driving system which drives the mask stage and the substrate stage.

With this arrangement, the illumination optical system illuminates the mask with the energy beam generated from the laser-excited plasma light source of the present invention, and the projection optical system projects the energy beam from the mask to the substrate. In this state, the driving system drives the mask stage and the substrate stage so that the mask and the substrate move in synchronization, and a pattern formed on the mask is thus projected and transferred to the substrate. Due to the operation of the laser-excited plasma light source of the present invention, the drop in the reflectance of the collecting mirror is reduced, the frequency of maintenance jobs for the replacement or the like for the collecting mirror is reduced, and the downtime of the apparatus is reduced and the production yield of devices is improved.

The present invention in a seventh aspect lies in a making method of an exposure apparatus used in a lithographic process, the method comprising: providing a laser-excited plasma light source according to the present invention; providing an illumination optical system which illuminates a mask with an energy beam emitted from the laser-excited plasma light source; providing a mask stage which holds the mask; providing a projection optical system which projects the energy beam emitted from the mask to a substrate; providing a substrate stage which holds the substrate; and providing a driving system which drives the mask stage and the substrate stage.

With this arrangement, the exposure apparatus of the present invention is made by mechanically, optically, and electrically combining and adjusting the laser-excited plasma light source of the present invention, the illumination optical system, the projection optical system, the substrate stage, the mask stage, the driving system, and a diversity of other components. In this case, a step-and-scan scanning exposure apparatus is made.

When exposure is performed by the exposure apparatus of the present invention in the lithographic process, a fine pattern as fine as a device rule of 100 nm to 70 nm is precisely transferred using exposure illumination light such as EUV light generated by the laser-excited plasma light source. By reducing the downtime of the apparatus for maintenance jobs for the collecting mirror or the like, the operation ratio of the apparatus is improved. Micro-devices

DESCRIPTION OF THE PREFERRED EMBODIMENTS

First Embodiment

Figure 1:
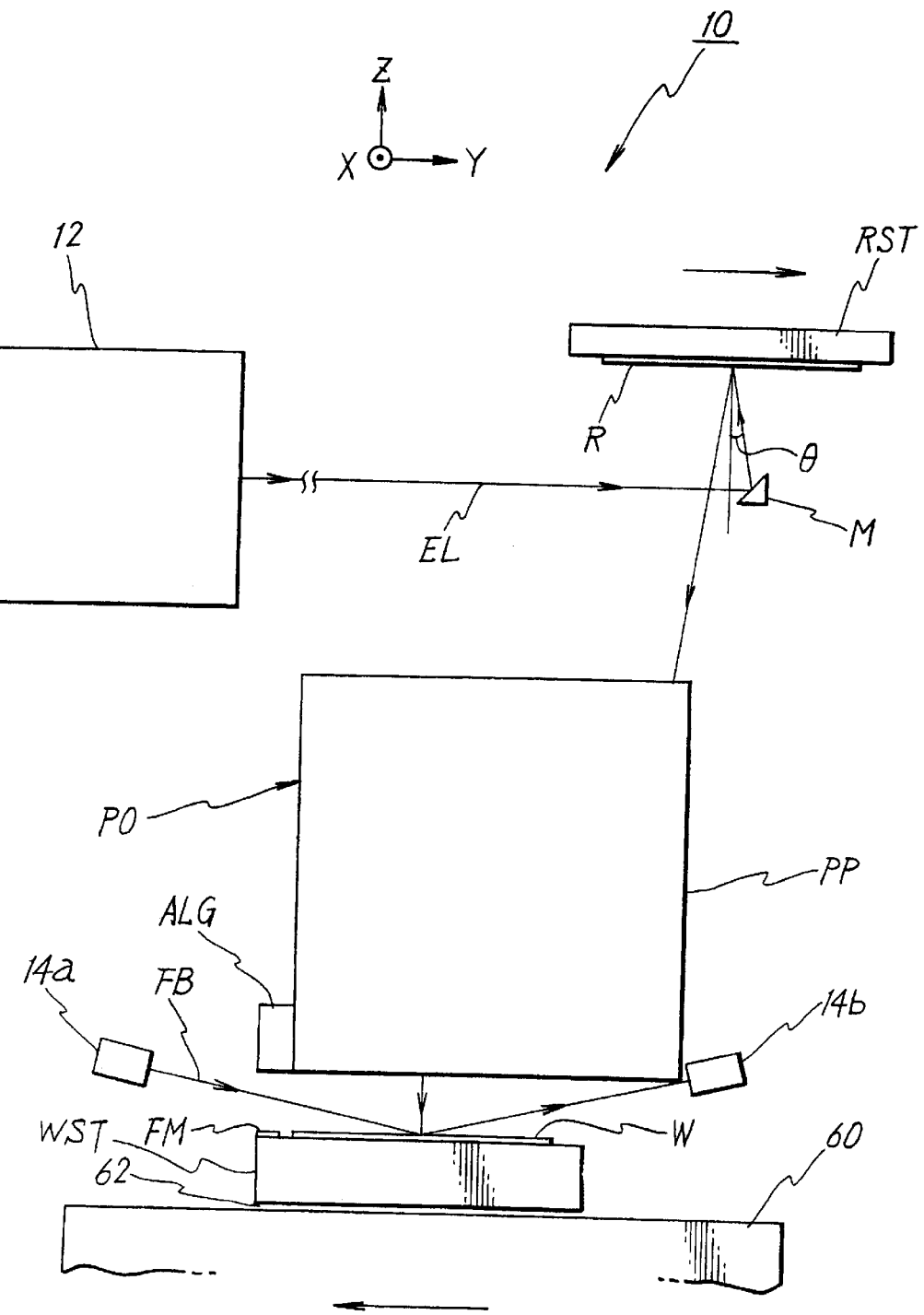
FIG. 1 is a diagrammatic view showing the construction of an exposure apparatus of a first embodiment of the present invention.
Figure 2:
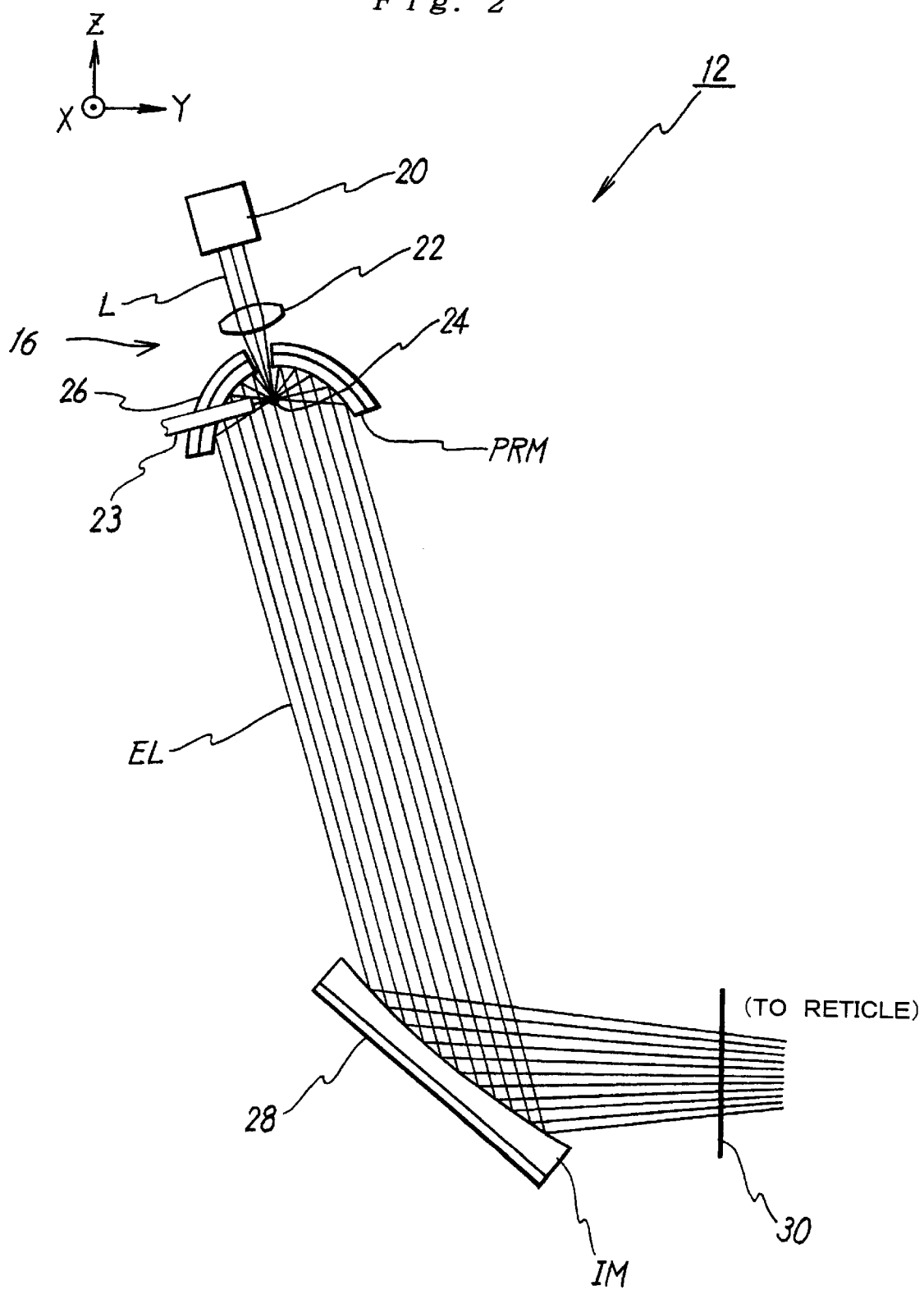
FIG. 2 is a view showing the internal construction of a light source device of FIG. 1.
Figure 3:
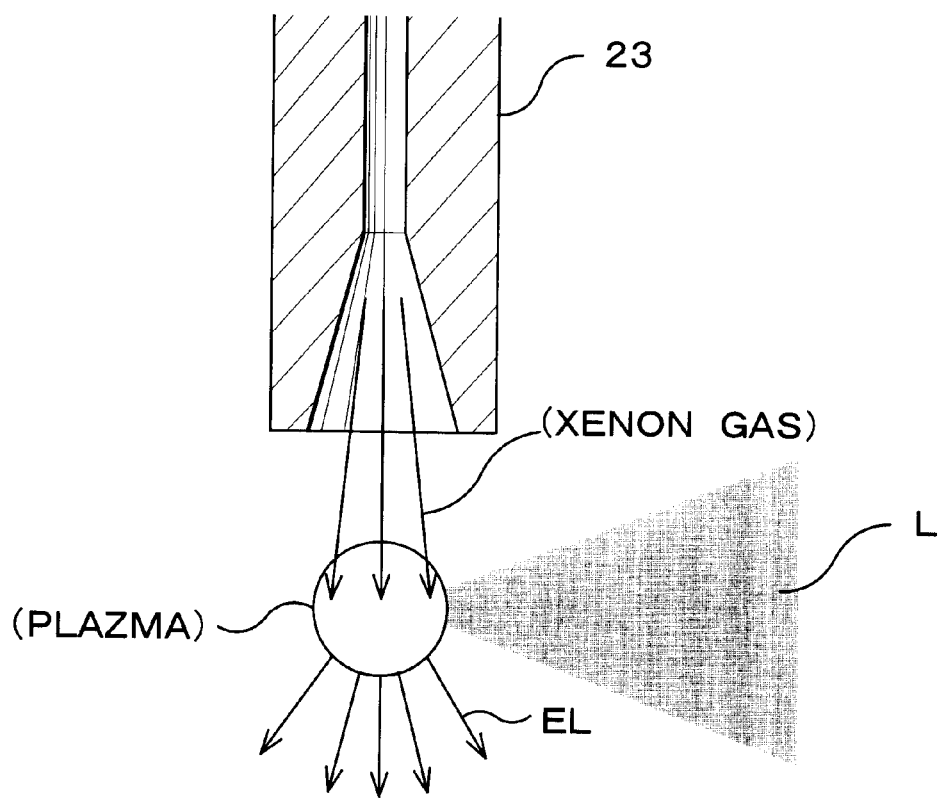
FIG. 3 shows the principle of generating EUV light in the light source device of FIG. 2, with a nozzle end portion partly cut away.

A first embodiment of the present invention is now discussed, referring to FIG. 1 through FIG. 3.

FIG. 1 diagrammatically shows the general construction of an exposure apparatus 10 of one embodiment, which includes a laser-excited plasma light source of the present invention as an exposure light source. The exposure apparatus 10, as will be discussed later, employs a projection optical system PO for projecting a luminous flux reflected from a reticle R as a mask to a wafer W as a substrate in a direction vertical to the wafer W. In the following discussion, the projection direction of an illumination light beam EL from the projection optical system PO to the wafer W is referred to as an optical axis direction of the projection optical system PO, and a Z axis direction represents the optical axis direction, a Y axis direction represents a direction lying in a plane perpendicular to the Z axis and lying in the page of FIG. 1, and an X axis direction represents a direction perpendicular to the page.

The exposure apparatus 10 projects a portion of an image of a circuit pattern drawn on a reflective reticle R as a mask to the wafer W as a substrate through the projection optical system PO while relatively scanning the reticle R and the wafer W relative to the projection optical system PO one-dimensionally (in the Y axis direction here). The entire circuit pattern of the reticle R is thus transferred to the wafer W respectively onto a plurality of shot areas sequentially in a step-and-scan method.

The exposure apparatus 10 includes a light source device 12 for horizontally emitting EUV light (light in the soft X ray region) EL having a wavelength within a range from 5 to 15 nm in the Y direction, a reflective mirror M (part of the illumination optical system) which reflects the EUV light EL from the light source device 12 so that the EUV light EL enters the pattern surface of the reticle R (the underside of the reticle R in FIG. 1) at an incident angle θ (θ is about 50 mrad here), a reticle stage RST for holding the reticle R, the projection optical system PO, formed of a reflective optical system, for projecting the EUV light reflected from the pattern surface of the reticle R to an exposure surface of the wafer W in a direction vertical to the wafer W, and a wafer stage WST for holding the wafer W.

Referring to FIG. 2, the light source device 12 includes a laser-excited plasma light source (hereinafter simply referred to as "light source") 16 and parts of the illumination optical system (PRM, IM, 30). The light source 16 includes a high output laser 20, such as a YAG laser which is a semiconductor excited laser or an excimer laser, a condenser lens 22 for condensing laser light L from the high output laser 20 to a predetermined converging point 24, and a nozzle 23 for discharging an energy-ray generating material, in this case a high-density xenon gas (Xe) as an EUV light radiating material (target), at a high speed.

FIG. 3 is an enlarged sectional view showing the end portion of the nozzle 23. The end portion of the nozzle 23 is manufactured of a specific material, here silicon which has a high transmittance to the EUV light as an energy beam, compared to those of heavy metals. A silicon layer having a thickness of only as 0.5 μm still has a transmittance of 50%.

Referring to FIG. 2 and FIG. 3, the mechanism for the generation of the EUV light is briefly discussed. The laser light L from the high output laser 20 is condensed to the converging point 24 through the condenser lens 22. When the high-density xenon gas released through the nozzle 23 at a high speed is irradiated with the laser light L at the converging point 24, the xenon gas is excited to a high-temperature plasma state by the energy of the laser light L, and releases the EUV light EL when the xenon gas transits to a lower potential state.

The EUV light EL thus generated scatters in all directions, and to condense the EUV light, a parabolic reflective mirror PRM is arranged in the light source device 12 as shown in FIG. 2. The parabolic reflective mirror PRM thus condenses the EUV light EL and collimates it into a parallel light flux. The parabolic reflective mirror PRM has an EUV light reflecting layer on the inner surface thereof to reflect the EUV light, and a cooling device 26 is mounted on the back side of the parabolic reflective mirror PRM. From the standpoint of cooling efficiency, the cooling device 26 preferably uses a cooling liquid, but the present invention is not limited to a cooling liquid. Metal is appropriate for the material of the parabolic reflective mirror PRM in view of thermal conduction.

The EUV light reflecting layer on the surface of the parabolic reflective mirror PRM is a multilayer film formed of 50 cycles of alternate layers of molybdenum (Mo) and silicon (Si) with the period of about 6.5 nm, and reflects the wavelength around 13 nm EUV light at 70%. The topmost layer of the multilayer film is formed of silicon (Si) with a view to prevent oxidization of molybdenum (Mo).

When the EUV light having a wavelength of 11 nm is used as the exposure light EL, the multilayer film may be formed by alternately laminating molybdenum (Mo) and beryllium (Be). In this case, the silicon (Si) layer preferably forms the topmost layer as an anti-oxidation layer. It is known that a silicon (Si) layer having a thickness of 0.5 μm transmits the EUV light at about 50%, and no problem is presented if the silicon layer is used.

Light rays, having an unreflected wavelength, is absorbed by the multilayer film, and changes to heat, thereby raising the parabolic reflective mirror PRM in temperature. To cool the parabolic reflective mirror PRM, the cooling device 26 is required. The EUV light collimated by the parabolic reflective mirror PRM is a parallel light beam being circular in cross section taken along a plane perpendicular to the optical axis and the distribution of strength thereof is uniform.

The gas cluster jet laser-excited plasma light source having a structure identical to that of the light source 16 is disclosed in detail in U.S. Pat. No. 5,577,092. As long as national laws in designated states or elected states, to which this international application is applied, permit, the disclosure of the above-cited United States Patent is fully incorporated by reference herein, except for the description relating to the materials of the nozzle.

The light source device 12 further includes an illumination mirror IM for reflecting the collimated EUV light EL toward the reflective mirror M shown in FIG. 1, and a wavelength selecting window 30 arranged downstream of the illumination mirror IM in the traveling direction of the EUV light EL (on the right-hand side of FIG. 2). Referring to FIG. 2, the illumination mirror IM has a curved surface on which the EUV light EL is incident, and the curved surface is formed of a reflective layer of a multilayer film identical to the surface of the parabolic reflective mirror PRM. The EUV light reflected from the reflective layer is designed to be an elongated arcuated slit shape on the reticle R.

The vertical direction lying in the page of FIG. 2 corresponds to the direction perpendicular to the longitudinal direction of an arc-shaped illumination area for illuminating the pattern surface of the reticle R to be discussed later (the illumination area having a shape partly cut from a ring illumination area), and the pattern surface of the reticle R just becomes a focal plane. In this case, the light source of the EUV light EL has a definite size, and the EUV light EL has a width of 1 mm to 10 mm on the pattern surface of the reticle R even though the pattern surface is a focal plane. This is not too narrow to illuminate the arc-shaped illumination area. A cooling device 28, having a structure similar to that of the cooling device 26, is mounted on the back side of the reflective surface of the illumination mirror IM.

The wavelength selecting window 30 is arranged to cut off visible light, and is formed of silicon (Si). The EUV reflecting film, constructed of a multilayer film, has a sensitive wave selectivity to wavelengths close to the EUV light, and selectively reflects the EUV light having a particular wavelength for exposure, but equally reflects visible light and ultraviolet light as well. If these light rays are guided to the reticle R or the projection optical system PO, the mirrors constituting the reticle R and the projection optical system PO are heated by the excessive energy. In the worst case, excessive light rays irradiate the wafer W, degrading the image thereon. The wavelength selecting window 30 serves the purpose of avoiding such problems.

Returning to FIG. 1, the reticle stage RST is mounted on an unshown reticle stage base arranged in the XY plane, and is supported in levitation over the reticle stage base by a two-dimensional, magnetic levitation linear actuator. The reticle stage RST is driven by predetermined strokes in the Y direction by the two-dimensional, magnetic levitation linear actuator while being finely driven in the X direction and θ direction (the direction of rotation around the Z axis).

The reticle stage RST is also finely driven in the Z direction and tilted to the XY plane (the direction of rotation around the X axis and the direction of rotation around the Y axis) by the two-dimensional, magnetic levitation linear actuator.

The position and the tilt of the reticle stage RST (the reticle R) in the Z direction are measured by an unshown position detection system (for instance, a focal position detection system based on an oblique incident light method or a laser interferometer affixed to a lens barrel PP of the projection optical system PO). The position of the reticle stage RST in the XY plane and the respective amount of rotation of the reticle stage RST (the amount of yawing, pitching, and rolling) are measured by an unshown laser interferometer system.

The measurement values by the position detector system and the laser interferometer system are sent to an unshown main controller and the main controller controls the two-dimensional, magnetic levitation linear actuator, and the reticle stage RST is thus controlled in six dimensions in position and posture.

The reticle stage RST chucks and holds, on the underside thereof, the reticle R on an unshown electrostatic-chuck type reticle holder. A reflective film is formed on the surface (the pattern surface) of the reticle R to reflect the EUV light. The reflective film is a multilayer film similar as of the film for the parabolic reflective mirror PRM and the illumination mirror IM. A substance for absorbing the EUV light is applied on the entire reflective film, and by patterning the absorbing film, the circuit pattern is thus formed of the reflective film and the absorbing film. Since the reflective film is formed on the surface of the reticle R in this way, the material of the reticle R itself is not a particular concern. A silicon wafer is, in this case, used as the material of the reticle R. If a silicon wafer is employed as the material of the reticle R, processing apparatus for use in the manufacture of semiconductor devices, such as a pattern drawing apparatus, a resist application apparatus, and an etching apparatus, can be directly used.

The projection optical system PO is non-telecentric on the object side, and telecentric on the image side. It employs a reflective optical system including a plurality of (three to eight, for instance) reflective optical element (mirrors). In this embodiment, the numerical aperture of the projection optical system PO is 0.12, and the projection magnification is ¼. The EUV light EL, reflected from the reticle R and which contains the pattern information drawn on the reticle R, is reduced to one-quarter by the projection optical system PO and then projected onto the wafer W.

The wafer stage WST is placed on a wafer stage base 60 arranged in the XY plane, and is supported by levitation with a two-dimensional, magnetic levitation linear actuator 62. The wafer stage WST is driven by a predetermined stroke in the X direction and the Y direction while being also driven in fine movements in the θ direction (in the direction of rotation around the Z axis), by the two-dimensional, magnetic levitation linear actuator 62. The wafer stage WST is driven in fine movements in the Z direction and tilted to the XY plane (in the direction of rotation around the X axis and in the direction of rotation around the Y axis) by the two-dimensional, magnetic levitation linear actuator 62.

The wafer stage WST chucks and holds, on its surface, the wafer W on an unshown electrostatic-chuck type wafer holder. The position of the wafer stage WST in the XY plane and the amount of rotation of the wafer stage WST (the amount of yawing, pitching, and rolling) are measured using an unshown laser interferometer system. The position and the tilt of the wafer W in the Z direction relative to the lens barrel PP are measured by a focus sensor 14 based on an oblique incident light method affixed onto the projection optical system PO. As shown in FIG. 1, the focus sensor 14 includes a light transmitting system 14a, affixed onto an unshown column which holds the lens barrel PP, for directing a sensor beam FB in an oblique direction to the surface of the wafer W. It also includes a light receiving system 14b, affixed onto the unshown column, for receiving the sensor beam FB reflected from the surface of the wafer W. Employed, as the focus sensor is the multiple focal position detection system disclosed in Japan Patent Laid Open No. 6-283403, which corresponds to U.S. Pat. No. 5,448,332. As long as national laws in designated states or elected states, to which this international application is applied, permit, the disclosure of the above-cited Japan Patent Laid Open and the above United States Patent are fully incorporated by reference herein.

The measurement values of the focus sensor 14 and the laser interferometer system are sent to the unshown main controller. The main controller controls the two-dimensional, magnetic levitation linear actuator 62, and thus the wafer stage WST is controlled in six dimensions in position and posture. The control in the Z direction is performed not only by considering the measurement values from the focus sensor 14, but also the measurement values obtained from the above-referenced position detection system of the reticle side.

An aerial image detector FM is mounted on one end of the upper surface of the wafer stage WST. It measures the positional relationship (so-called baseline measurement) between a position where the pattern drawn on the reticle R is projected, and the position of an alignment optical system ALG to be discussed later. The aerial image detector FM corresponds to a reference mark plate in conventional DUV exposure apparatus.

In this embodiment, the alignment optical system ALG is affixed to the side of the projection optical system PO as shown in FIG. 1. The alignment optical system ALG may be an image forming type alignment sensor which irradiates a broad-band light on an alignment mark (or the aerial image detector FM) on the wafer W and receives a reflected light, which is image processed and thus detecting the mark. Or it maybe an LIA (Laser Interferometric Alignment) type alignment sensor, which irradiates a grating mark on the wafer with a laser beam from two directions. This causes two diffracted light beams generated from the grating mark to interfere with each other, and detects the position of the grating mark from the phase of the interference light, or a scanning probe microscope such as an atomic force microscope.

Discussed next is the exposure process of the exposure apparatus 10 in this embodiment that is made as described above.

The reticle R is transferred by an unshown reticle transferring system, and is then chucked and held at a loading position by the reticle stage RST. The main controller controls the positions of the wafer stage WST and the reticle stage RST, and a projected image of an unshown reticle alignment mark drawn on the reticle R is detected using the aerial image detector FM, thus determining the projected position of the reticle pattern image. That is, the reticle alignment is performed.

The main controller then moves the wafer stage WST so that the aerial image detector FM comes just under the alignment optical system ALG. It then determines the relative positional relationship between the image forming position of the pattern of the reticle R and the position of the alignment optical system ALG. In short, the baseline amount is obtained based on the detected signal from the alignment optical system ALG and the measurement values of the interferometer system.

When the baseline measurement is completed, the main controller performs wafer alignment such as EGA (enhanced global alignment), and determines the positions of all shot areas on the wafer W. The EGA is disclosed in detail in Japan Patent Laid Open No. 61-44429 and the corresponding U.S. Pat. No. 4,780,617. The disclosure of the above-cited Japan Patent Laid Open and the above United States Patent are fully incorporated by reference herein.

Then, exposure by the step-and-scan method is performed, and the EUV light EL is used as an exposure illumination light as discussed below. In accordance with the obtained position information of each shot area, the main controller positions the wafer stage WST at the starting position of a first shot area as well as position the reticle stage RST at the starting position, while monitoring the position information from the interferometer system. Thus, the scanning exposure of a first shot area is performed. During the scanning exposure, the main controller relatively drives the reticle stage RST and the wafer stage WST in opposite directions, while controlling the two stages so that the velocity ratio of the two stages almost matches the projection magnification of the projection optical system PO. The main controller thus performs exposure (a transfer of the reticle pattern) with the velocity ratio of the two stages synchronized at a constant speed. The magnification error between the first shot area and the transferred image of the reticle pattern in respect to the moving direction of the wafer W, can be corrected by adjusting at least either the moving velocity of the reticle stage RST and the wafer stage WST so that the velocity ratio of the reticle R and the wafer W differs from the projection magnification of the projection optical system PO.

When the scanning exposure of the first shot area is completed, a stepping operation is performed to move the wafer stage WST to the starting position of the second shot area. The scanning exposure of the second shot area is thus performed in the same manner as described above. The same operation is repeated for a third shot area and subsequent shot areas.

In this way, the stepping operation between shots and the scanning exposure operation for each shot are then repeated, thereby transferring the pattern of the reticle R to all shot areas on the wafer W in the step-and-scan method.

During scanning exposure and alignment, the focus sensors (14a and 14b) which are integrally affixed to the projection optical system PO, measure the space in between the surface of the wafer W and the projection optical system PO (the image plane of the optical system), and the tilt of the wafer W in respect to the XY plane (the image plane). The main controller controls the wafer stage WST so that the space between the surface of the wafer W and the projection optical system PO is always constant and have the same parallel degree. In accordance with the measurement values of the position detecting system of the reticle, the main controller synchronously moves the reticle stage RST and the wafer stage WST in the Y direction while adjusting the position of the projection optical system PO in the optical axis (the Z direction). This is to make the space between the projection optical system PO and the pattern surface of the reticle R during the exposure (during the transfer of the reticle pattern) constant.

As discussed earlier, the exposure apparatus 10 of this embodiment uses the EUV light EL which has an extremely short wavelength to transfer the pattern of the reticle R via the projection optical system PO free from color aberration and having total reflection. Accordingly, the fine pattern of the reticle R is transferred to each shot area on the wafer W with a high accuracy. Specifically, a fine pattern as fine as a design rule of 100 nm to 70 nm can be accurately transferred.

With the present embodiment, the end portion of the nozzle 23 structuring the light source 16 is formed of silicon (Si). Therefore, even if the end portion of the nozzle 23 is eroded, damaged, and scattered by the high temperature plasma, the reflectance of the parabolic reflective mirror PRM and the illumination mirror IM suffer from almost no drop by the sputtered particles (debris) of the nozzle 23. This is because the silicon (Si) film is formed on the surface of the parabolic reflective mirror PRM, the illumination mirror IM, and the like. Consequently, this reduces the frequency of maintenance jobs, such as the replacement of the collecting mirrors in the parabolic reflective mirror PRM, the illumination mirror IM and the like. The downtime of the apparatus is accordingly reduced, and the improvement in the operation ratio of the apparatus lead to the improvement in production yield of devices.

Figure 4:
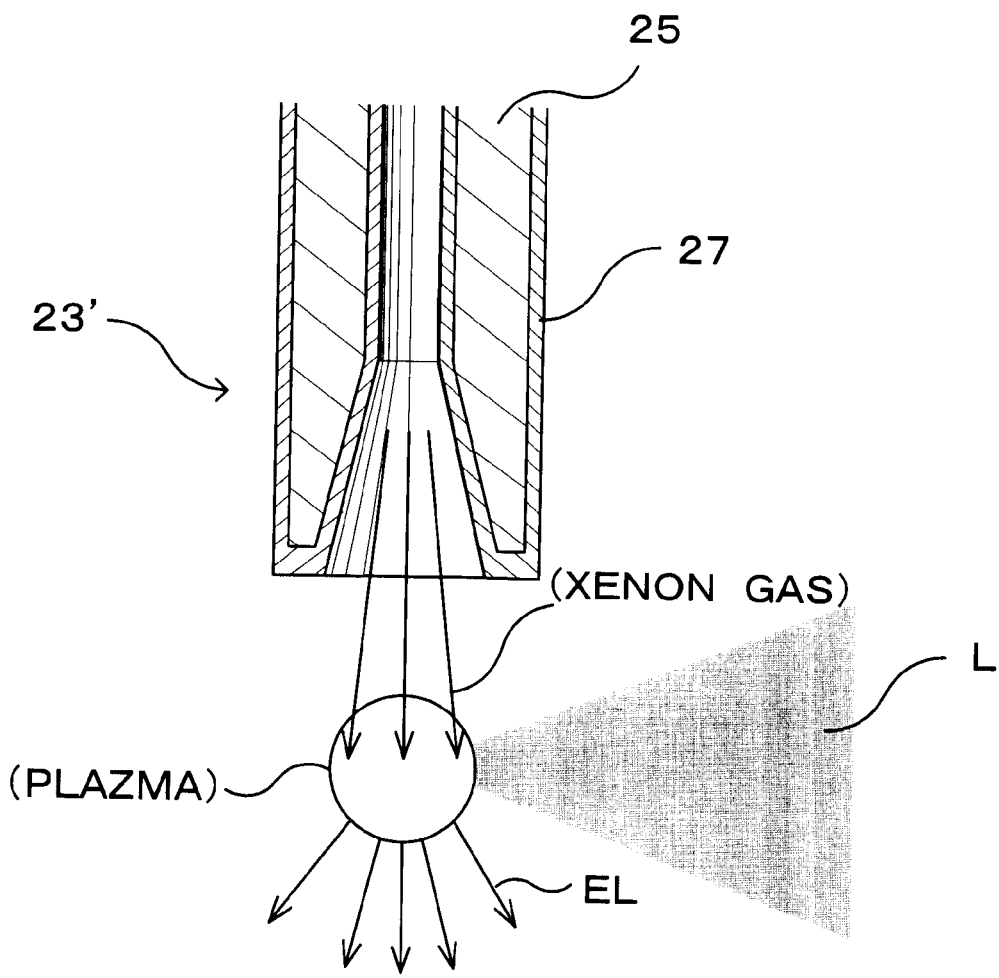
FIG. 4 is a sectional view showing the construction of a nozzle of a modification of the embodiment.

Although the nozzle 23 itself is manufactured of silicon Si in the above embodiment, the present invention is not limited to this. For instance, as shown in FIG. 4, the end portion of a nozzle 23' may be formed of a base member 25 made of a metal, such as iron (Fe), titanium (Ti), tungsten (W), or an alloy, or carbon, and a silicon (Si) coating layer which is coated to a predetermined thickness as a specific material on the surface of the base member 25. In such a case, the effect is as good as the first embodiment, and is advantageous since metal is easier to process than silicon so the nozzle can be manufactured easily. The base 25 is preferably formed of a high melting point metal, such as tungsten (W) or carbon, in view of the high heat resistance. Although the nozzle 23 itself is manufactured of silicon Si in the above embodiment, the present invention is not limited to this. For instance, as shown in FIG. 4, the end portion of a nozzle 23' may be formed of a base member 25 made of a metal, such as iron (Fe), titanium (Ti), tungsten (W), or an alloy, or carbon, and a silicon (Si) coating layer which is coated to a predetermined thickness as a specific material on the surface of the base member 25. In such a case, the effect is as good as the first embodiment, and is advantageous since metal is easier to process than silicon so the nozzle can be manufactured easily. The base 25 is preferably formed of a high melting point metal, such as tungsten (W) or carbon, in view of the high heat resistance.

In the embodiment above and the modification shown in FIG. 4, the specific material of the entire end portion of the nozzle or the surface layer of the nozzle is silicon (Si). This is because silicon has an extremely high transmittance to the EUV light, and is appropriate as a material for use as a surface of the mirror reflective film, thus from a standpoint of maintaining the high reflectance of the reflective mirror, silicon (Si) is used. The present invention, however, is not limited to silicon (Si). Specifically, beryllium may be used as the specific material. When the 11 nm wavelength EUV light is used, instead of the above-referenced 13 nm wavelength EUV light, the multilayer film of alternate layers of molybdenum (Mo) and silicon (Si) is used as a reflective film, as already discussed. In this case, beryllium is suitable for the topmost layer of the multilayer film to prevent oxidation of molybdenum, and in such a case, selecting beryllium as the specific material is particularly effective. To transfer 70 nm L/S pattern or 50 nm L/S isolated pattern, a projection optical system having a numerical aperture of 0.1 to 0.12 is used in the 13 nm wavelength EUV light (typically of wavelength of 13.4 nm). And a projection optical system having a numerical aperture of 0.08 to 0.1 is used in the 11 nm wavelength EUV light (typically of wavelength of 11.5 nm). In each of the following embodiments, the EUV light having a wavelength of 13.4 nm is typically employed as the 13 nm wavelength EUV light.

In the embodiment above, the illumination area is arc-shaped. The illumination area is, however, not limited to this shape. Even with the EUV exposure apparatus, the illumination area may have a rectangular slit shape. In this case, however, the number of mirrors constituting the projection optical system need to be increased to some extent.

In the first embodiment, a xenon gas is used as the energy-ray generating material (target). The energy-ray generating material is not limited to this gas, and alternatively, a gas, such as krypton, water, carbon fluoride, fluorine, diborane, oxygen, or argon may be used as a target.

In the first embodiment, as discussed above, the nozzle 23 is formed of silicon (Si), which is one of the material forming the reflective film on the surface of the parabolic reflective mirror PRM and the illumination mirror IM in the light source device 12. Taking advantage of the fact that the sputtered particles (debris) of the nozzle 23 deposited on the parabolic reflective mirror PRM and the illumination mirror IM, result in a marginal drop in the reflectance of the mirrors, the drop in the reflectance of the optical elements is thus controlled. However, subsequent to a continuous operation of many hours, the debris or oil from the evacuator is deposited on the surfaces of the parabolic reflective mirror PRM and the illumination mirror IM and reduces the reflectance. The intensity of the EUV light irradiating the reticle R, therefore, becomes insufficient. In such a case, the operation of the apparatus is stopped, the light source (device) is disassembled, and the optical element is replaced or removed and then put back in place after cleaning it.

The following second embodiment has been developed to make the maintenance job efficient with a view to eliminating the need for the disassembling of the apparatus.

Second Embodiment

Figure 5:
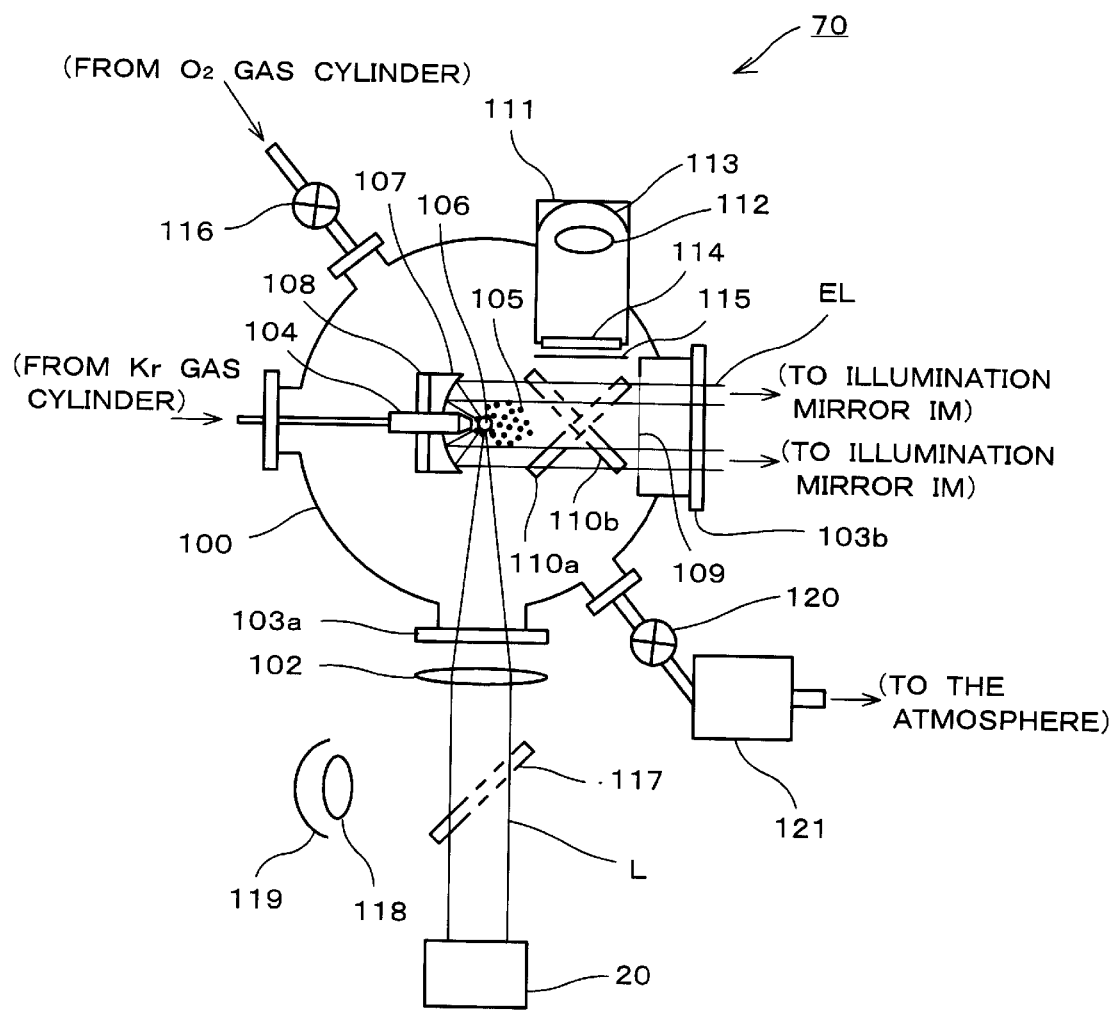
FIG. 5 is diagrammatic view showing a light source in accordance with a second embodiment of the present invention.

A second embodiment of the present invention is now discussed, referring to FIG. 5. Since the second embodiment is identical in structure to the first embodiment except for the structure of the light source (laser-excited plasma light source), the light source of the second embodiment is now discussed. FIG. 5 shows the general construction of a laser-excited plasma light source 70 of the second embodiment.

The light source 70 includes: a high output laser 20 as a laser light source; a vacuum chamber 100 enclosing a nozzle 104 and its peripheral members; a condenser lens 102 arranged in the optical path of a laser beam L emitted from the high output laser 20 to the vacuum chamber 100; a multilayer film parabolic mirror 107 identical to the above-referenced parabolic reflective mirror PRM integrally attached to the nozzle 104 in the vacuum chamber 100; a heater 108 for heating the multilayer film parabolic mirror 107; an ultraviolet light lamp chamber 111 fixed in a predetermined position of the vacuum chamber 100; a valve 116 for supplying an oxygen gas, connected to the vacuum chamber 100 via piping; an exhaust valve 120; and a vacuum evacuator 121 connected to piping of the exhaust valve 120.

The vacuum chamber 100 includes a laser beam input window 103a provided in the optical path of the laser beam L passing through the condenser lens 102. An output window 103b for the EUV light (hereinafter simply referred to as an "X ray" since the light is within the soft X ray region) EL which is generated as an energy beam, is arranged in a direction substantially perpendicular to the optical path of the laser beam L. On the internal side of the output window 103b, an X-ray transmitting and visible light cutting filter (hereinafter simply referred to as an "X ray filter") 109 is arranged. A laminate of a Mo film of 0.3 μm thick on a Si film of 0.5 μm thick is employed for the X ray filter 109.

The vacuum chamber 100 further includes an aluminum (Al) mirror 110, which is retracted from and inserted in the optical path of the EUV light EL by an unshown driving system with the tilt angle variable as represented by imaginary lines 110a and 110b in FIG. 5.

The multilayer film parabolic mirror 107 has its focal point approximately coinciding with the converging point of the laser beam L, and the nozzle 104 penetrates the center and is fixed to the multilayer film parabolic mirror 107. Similar to the parabolic reflective mirror PRM, the multilayer film of the multilayer film parabolic mirror 107 is manufactured by alternately laminating molybdenum (Mo) and silicon (Si), and the period length (thickness) of the multilayer film is determined so the central wavelength of the reflected EUV light be 13 nm. The period length (thickness) of the multilayer film varies depending on the position of the mirror so that the central wavelength of the EUV light reflected from the overall surface of the mirror is 13 nm.

The nozzle 104 is a pulse-jet nozzle that releases a krypton gas (Kr gas) as the energy-ray generating material (target) at a back pressure of 50 atmospheres, and the opening time of the nozzle is about 500 μs. In this embodiment, the end portion of the nozzle is formed of diamond, and the surface of the nozzle 104 itself is coated with diamond. A distance of 1 mm is allowed between the converging point of the laser beam, i.e., the focal point of the multilayer film parabolic mirror 107 where the plasma is generated as will be discussed later, and the tip of the nozzle 104.

The ultraviolet light lamp chamber 111 houses an excimer lamp 112 and a mirror 113 which reflects ultraviolet light generated by the excimer lamp 112, and a window 114 opposite to the mirror 113 in the ultraviolet light lamp chamber 111. A shutter 115 is arranged on the outside of the window 114, i.e., inside the vacuum chamber 100, to prevent the sputtered particles from depositing on the window 114. The shutter 115 normally covers the window 114, and is opened only when the excimer lamp 112 operates for irradiation.

The operation of the light source 70 thus constructed is now discussed.

A krypton (Kr) gas as the energy-ray generating material (target) is introduced into the vacuum chamber 100 via a field through and is then released into the vacuum of the vacuum chamber 100 through the nozzle 104. The Kr gas released into the vacuum chamber 100 at a back pressure of 50 atmospheres, and the temperature within the vacuum chamber 100 sharply drop due to adiabatic free expansion the attraction between atoms being enhanced by the Van der Waals force, forming a large cluster molecule 105. The number of atoms in the cluster molecule 105 range from several tens of atoms to several thousands of atoms.

Several hundred microseconds after the nozzle 104 is opened and the Kr gas is released into the vacuum, the high output laser 20 irradiates the gas and the cluster molecule 105 with the laser beam L via the condenser lens 102 and the window 103a. Plasma 106 is thus generated, and the EUV light EL and other energy beams radiate in all directions. The EUV light having the wavelength of 13 nm, from among the energy beams, is reflected from the multilayer film parabolic mirror 107 and becomes a collimated luminous flux, and is transmitted through the X ray filter 109, and is incident on the above-referenced illumination mirror IM. The Al mirror 110 is retracted from the optical path of the EUV light reflected from the multilayer film parabolic mirror 107.

The gas and the number of the cluster molecule 105, and its density rapidly decrease in accordance with the distance from the nozzle 104. To increase the dose of the X-ray, it is preferable for the converging and irradiation point of the laser beam, i.e., plasma generation position, to be closer to the nozzle 104. The distance between the plasma generation position and the nozzle 104 is, therefore, set to be 1 mm in this embodiment.

When the light source 70 is continuously operated for some time, fast atoms, ions, and electrons released from the plasma 106 collide and abrade the nozzle 104 and its peripheral members. The abraded material (carbon C in this case) is scattered in the environment, and is stuck and deposited onto the multilayer film parabolic mirror 107 and the X-ray filter 109. These materials deposited on the optical elements absorb the EUV light, thereby reducing the reflectance of the mirror and the transmittance of the filter.

In this embodiment, the X-ray dose is checked after the operation of a predetermined number of hours, or is monitored by an X ray dose monitor after being transmitted through the X ray filter 109. When the X-ray dose drops below a predetermined value, the operation of the light source 70 is suspended. Oxygen is then introduced into the vacuum chamber 100 through the valve 116. By adjusting the valve 116 and the exhaust valve 120, the pressure within the vacuum chamber 100 is set to a predetermined pressure. The predetermined pressure is a pressure under which the ultraviolet light from the excimer lamp 112 reaches the multilayer film parabolic mirror 107 or the X ray filter 109 in a sufficiently high dose and with a sufficiently small attenuation. A sufficient amount of oxygen molecules (or ozone generated from oxygen due to photochemical reaction by the irradiation of ultraviolet light) is also necessary close to the surface of the multilayer film under the predetermined pressure. The oxygen molecule react with carbon in the scattered material deposited on the multilayer film parabolic mirror 107 or the X-ray filter 109. The pressure greatly varies depending on the optical path length of the ultraviolet light and the removal speed required, and ranges from several hundredths of Torr to several tens of Torr (1 Pa–8000 Pa). The adjustment of the valves 116 and 120 is performed by an unshown control system.

Next, the Al mirror 110 is inserted by an unshown driving system to a position represented by the imaginary line 110a as shown in FIG. 5.

Then, the shutter 115 is opened by an unshown control system opens via an unshown shutter driving system, lighting the excimer lamp 112 in the ultraviolet light lamp chamber 111. The ultraviolet light emitted from the excimer lamp 112 passes through the window 114, is reflected on the Al mirror 110, and then illuminated on the multilayer film parabolic mirror 107.

Since the multilayer film parabolic mirror 107 is then in an oxygen atmosphere, the scattered material (carbon) deposited on the surface of the multilayer film parabolic mirror 107 reacts with oxygen, making monoxide (CO) or carbon dioxide ($CO_2$), thus being removed from the multilayer film parabolic mirror 107. The multilayer film parabolic mirror 107 thus restores its initial reflectance value. Also, in this embodiment, to expedite the reaction the multilayer film parabolic mirror 107 is heated by the heater 108, which is attached on the back of the multilayer film parabolic mirror 107.

And, by changing the tilt angle of the Al mirror 110 to the position represented by the imaginary line 110b shown in FIG. 5, carbon stuck and deposited on the X ray filter 109 can be removed in the same manner as above. The transmittance of the X-ray filter 109 can then be restored to the initial state.

Similarly, carbon is also deposited on the vacuum side of the laser beam input window 103a. In this case, as in FIG. an excimer lamp 118 and a mirror 119 can be arranged, and another Al mirror inserted at the position represented by the imaginary line 117. Then, the excimer lamp 118 can be turned on to illuminate the laser beam input window 103a. When the light source 70 is used for an apparatus other than the exposure apparatus, the excimer lamp may be arranged in the atmosphere. In the atmosphere, however, the light from the excimer lamp 118 is absorbed by oxygen in the atmosphere. In such a case, the excimer lamp 118 and the space to the window 103 may be enclosed in a member, and the member may be purged with nitrogen or exhausted.

As discussed above, the light source 70 of the second embodiment allows the apparatus to continuously operate for a long period of time. When the strength of the EUV light transmitted through the X ray filter 109 drops below a predetermined value, the light emission of the light source 70 is suspended, and optical cleaning of the optical elements can be performed without disassembling the apparatus. Thus, the transmittance and the reflectance of the optical elements are quickly restored back to the initial state, and the downtime of the apparatus for maintenance can be reduced. With the scanning type exposure apparatus having the light source 70 as the exposure light source, the presence of the vacuum chamber prevents the scattered material from being deposited on the illumination mirror IM, and is almost free from maintenance of the illumination mirror IM. Besides the advantages as in the first embodiment, the scanning type exposure apparatus also has an improved efficiency in maintenance, and an improved operation ratio, thereby leading to substantial improvements in the productivity of devices.

With the scanning type exposure apparatus having the light source 70 as the exposure light source, since it has the X ray filter 109, the wavelength selecting window 30 described earlier is not necessarily required.

Third Embodiment

Figure 6:
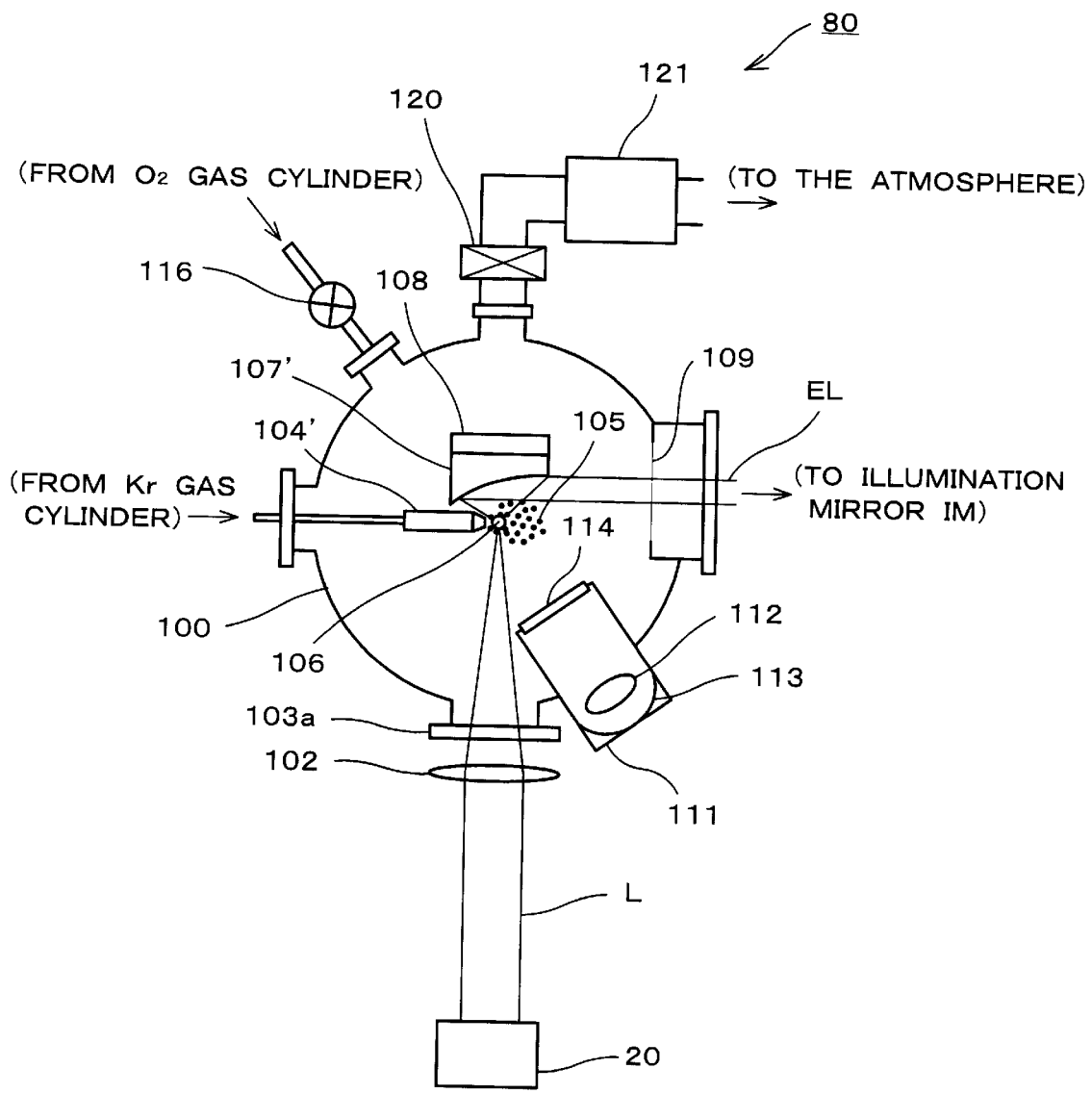
FIG. 6 is diagrammatic view showing a light source in accordance with a third embodiment of the present invention.

A third embodiment of the present invention is now discussed, referring to FIG. 6. Components identical or equivalent to those described in connection with the second embodiment are designated with the same reference numerals, and the discussion thereabout is briefly made or is entirely omitted.

Like the second embodiment, the third embodiment is identical in structure to the first embodiment except for the structure of the light source (laser-excited plasma light source), therefore the light source of the third embodiment is discussed below.

FIG. 6 shows the general structure of a laser-excited plasma light source 80 of the third embodiment. The laser-excited plasma light source 80 has a basic structure similar to that of the light source 70 in the second embodiment in principle, and the difference between the light source 70 is discussed below.

Specifically, the light source 80 includes a nozzle 104' instead of the nozzle 104 and a multilayer film parabolic mirror 107' instead the multilayer film parabolic mirror 107. The position and arrangement of the ultraviolet light lamp chamber 111 is also different compared to the vacuum chamber 100, and the shutter 115 is not arranged.

Similar to the nozzle 104, the nozzle 104' is a pulse-jet nozzle that releases a krypton gas (Kr gas) as the energy-ray generating material (target) at a back pressure of 50 atmospheres, and the nozzle is opened for about 500 μs. The distance between the plasma generation position and the tip of the nozzle 104' is 1 mm. Unlike the nozzle 104, however, the tip of the nozzle 104' and its peripheral portion are formed of Kevlar (one species of organic compounds). For this reason, the scattered material stuck and deposited onto the multilayer film parabolic mirror 107' is an organic material, as will be described next.

The multilayer film parabolic mirror 107' has a reflective surface configuration different from that of the multilayer film parabolic mirror 107, and is arranged separately from the nozzle 104' in a position suitable for its configuration. Formed on the reflective surface of the multilayer film parabolic mirror 107' is a multilayer film of molybdenum (Mo) and silicon carbide (SiC), and the period length (thickness) of the multilayer film is determined so that the central wavelength of the reflected EUV light is 13 nm. Since the Mo/SiC multilayer film has a heat resistance higher than that of the Mo/Si multilayer film, the multilayer film parabolic mirror 107' can be heated higher by the heater 108 mounted on the rear of the mirror. This is advantageous because the reaction of carbon with oxygen or ozone, to be discussed later, is expedited.

As shown in FIG. 6, the ultraviolet light lamp chamber 111 is arranged on the vacuum chamber 100 in a position which does not block the paths of the laser beam L and the EUV light EL. It is also arranged in a direction so that the ultraviolet light can be irradiated on the multilayer film parabolic mirror 107' at all times.

The operation of the light source 80 is briefly discussed next.

Like the light source 70, the light source 80 generates the plasma 106 by converging the laser beam L at a gaseous target or cluster target (Kr here) released through the nozzle 104'. The EUV light EL generated from the plasma 106 is reflected on the multilayer film parabolic mirror 107', and only the EUV light having the designed wavelength of the multilayer film, passes through the X ray filter 109 and is guided to the later-stage illumination mirror IM.

Substantially concurrent with the start of the generation of the EUV light EL, an unshown control system turns on the excimer lamp 112 in the ultraviolet light lamp chamber 111, and ultraviolet light is directed to the multilayer film parabolic mirror 107' through the window 114. The control system opens a valve 116 and lets oxygen gas from an oxygen tank into the vacuum chamber 100, while opening the valve 120 and evacuating the gas interior of the vacuum chamber 100 through the vacuum evacuator 121. The control system further adjusts the valves 116 and 120 so that the internal pressure within the vacuum chamber 100 reaches a predetermined pressure. The predetermined pressure is a pressure under which the attenuation of the required energy beam (the 13 nm wavelength EUV light in this case) from among the energy beams generated from the plasma 106 is sufficiently small, and the ultraviolet light from the excimer lamp 112 reaches the multilayer film parabolic mirror 107' in a sufficiently high dose and with a sufficiently small attenuation. A sufficient amount of oxygen molecules (or ozone generated from oxygen due to photochemical reaction by the irradiation of ultraviolet light) is also necessary close to the surface of the multilayer film parabolic mirror 107' under the predetermined pressure. The oxygen molecule reacts with the organic material on the multilayer film parabolic mirror 107'. The pressure greatly varies depending the optical path length of the ultraviolet light and a required removal speed, and ranges from several hundredths of Torr to several tens of Torr (1 Pa–8,000 Pa).

As discussed above, according to the third embodiment, besides the advantages as in the second embodiment, the ultraviolet light can be continuously irradiated directly without blocking the EUV light and the laser beam, and carbon on the optical elements can be removed even when EUV light is being generated. The third embodiment thus improves the operation ratio of the light source, and permits a continuous operation even longer than the second embodiment. accordingly, the scanning type exposure apparatus using the light source 80 as an exposure light source can provide a higher operation ratio of the apparatus and a higher productivity of devices.

Although the above embodiment has been discussed in connection with the removal method of the deposit only on the multilayer film parabolic mirror 107', the carbon-based deposit on the X ray filter 109 and the laser beam input window 103a can be similarly removed.

Fourth Embodiment

Figure 7:
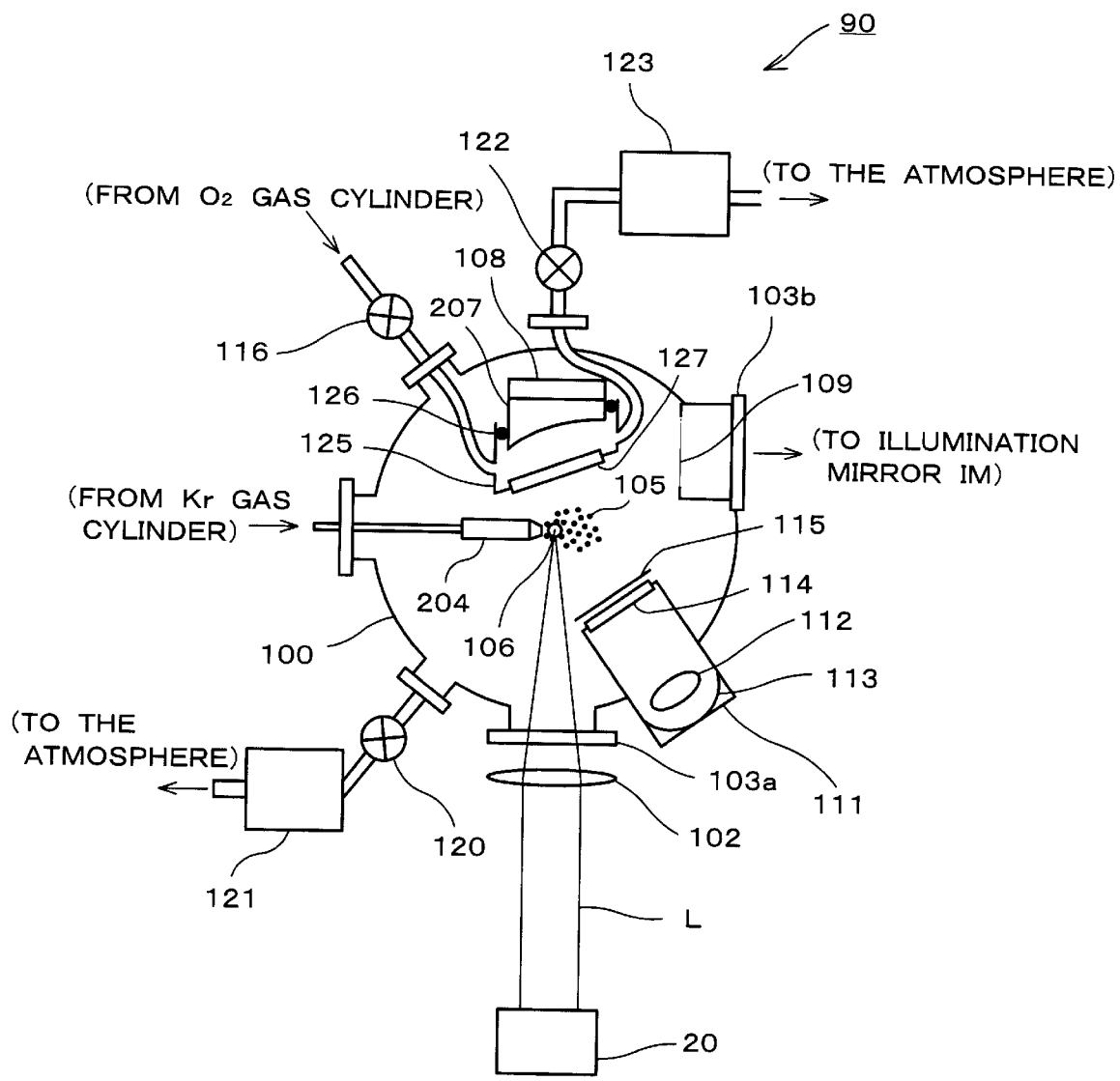
FIG. 7 is diagrammatic view showing a light source in accordance with a fourth embodiment of the present invention.

A fourth embodiment of the present invention is now discussed, referring to FIG. 7. Components identical to or equivalent to those described in connection with the above-referenced second and third embodiments are designated with the same reference numerals, and the discussion thereabout is briefly made or entirely omitted here.

Like the second and third embodiments, the fourth embodiment is identical in structure to the first embodiment except for the structure of the light source (laser-excited plasma light source), and the light source of the fourth embodiment is now discussed.

FIG. 7 shows the general structure of a laser-excited plasma light source 90 of the fourth embodiment. The laser-excited plasma light source 90 has a structure basically identical to that of the light sources 70 and 80 of the second and third embodiments, and the difference is discussed below.

Specifically, the light source 90 has a nozzle 204 instead of the nozzle 104 or 104', and a multilayer film parabolic mirror 207 instead of the multilayer film parabolic mirror 107 or 107'. It further has a cover 125, which is detachably engaged with the multilayer film parabolic mirror 207 in the vacuum chamber 100, an exhaust valve 122 arranged in piping which is connected with the interior of the cover 125, and a vacuum evacuator 123 connected to the exhaust valve via piping.

Similar to the nozzle 104 and the like, the nozzle 204 is a pulse-jet nozzle which releases a krypton gas (Kr gas) as the energy-ray generating material (target) at a back pressure of 50 atmospheres, and the nozzle is opened for about 500 $\mu$s. The distance between the plasma generation position and the tip of the nozzle 204 is 1 mm. Unlike the nozzle 104 or the like, however, the tip of the nozzle 204 and its peripheral portion are formed of SiC.

The multilayer film parabolic mirror 207 has a reflective surface configuration different from that of the multilayer film parabolic mirror 107, and is arranged separately from the nozzle 204 in a position suitable for its configuration. Formed on the reflective surface of the multilayer film parabolic mirror 207 is a multilayer film of Mo and Si, and the period length (thickness) of the multilayer film is determined so that the central wavelength of the reflected EUV light is 13 nm.

As shown in FIG. 7, in the fourth embodiment, the ultraviolet light lamp chamber 111 is arranged on the vacuum chamber 100 in a position which does not block the paths of the laser beam L and the EUV light EL. And, it is arranged in a direction so that the ultraviolet light can be irradiated on the multilayer film parabolic mirror 207. The shutter 115, which open and close the window 114 of the ultraviolet light lamp chamber 111, is also arranged.

The cover 125 is attached to and detached from the multilayer film parabolic mirror 207 by an unshown drive mechanism controlled by an unshown controller. When the cover 125 is attached to the multilayer film parabolic mirror 207, the end of the intake piping connected to the cover 125 is connected to the piping connected to the valve 116 at the opening end on the side of the vacuum chamber 100. The cover 125 has, at its inner circumference, an O-ring (or a gasket) 126 to seal the interior of the cover when it is attached to the multilayer film parabolic mirror 207. The cover 125 is normally open (during the generation of the EUV light). The cover 125 is also provided with a window 127.

With the light source 90 of the fourth embodiment which is structured as described above, plasma 106 is generated by irradiating the Kr gas released through the nozzle 204 with the laser beam L like the second and third embodiments. The EUV light EL, which is thus generated, is guided to the illumination mirror IM. When the EUV light EL is generated for a continuous period of hours, the nozzle 204 and its peripheral portion are abraded by the plasma, and silicon (Si) and carbon (C) are deposited on the multilayer film parabolic mirror 207.

The unshown control system monitors the intensity of the EUV light EL through an unshown sensor, thereby monitoring a variation in the reflectance of the multilayer film parabolic mirror 207. When a drop in the reflectance is detected, the control system stops discharging the Kr gas through the nozzle 204 and irradiating the laser beam L (the operation of the light source 90 is suspended).

The control system, then, attaches the cover 125 to the multilayer film parabolic mirror 207 via the unshown driving system and seals the interior of the cover 125, while connecting the end of the intake piping connected to the cover 125 to the piping connected to the valve 116 at the opening end on the side of the vacuum chamber 100. FIG. 7 shows the cover, which has completed attachment and piping connection.

Next, the control system opens the valve 116 to let the oxygen gas in, and exhausts the gas within the cover 125 through the vacuum evacuator 123 by opening the valve 122. The control system adjusts the internal pressure within the cover 125 to a predetermined pressure by adjusting the valves 116 and 122.

The control system then opens the shutter 115, and turns on the excimer lamp 112 in the ultraviolet light lamp chamber 111. Ultraviolet light from the excimer lamp 112 is transmitted through the windows 114 and 127, and is irradiated on the multilayer film parabolic mirror 207. Silicon (Si), besides carbon (C), is deposited on the reflective surface of the multilayer film parabolic mirror 207. The reflectance of the multilayer film parabolic mirror 207, however, is not reduced much even if silicon (Si) is deposited on the mirror, because silicon has a high transmittance to the 13 nm wavelength EUV light (in the soft X ray region) (the absorption limit of Si is 12.4 nm). On the other hand, carbon-based deposits adhered on the multilayer film parabolic mirror 207 are removed through the reaction of oxygen with the ultraviolet light in the cover 125 in the manner described earlier, and are thus removed from the multilayer film parabolic mirror 207.

As discussed above, with the light source 90 and the scanning type exposure apparatus incorporating the light source 90 in the fourth embodiment, besides having the same advantages as those of the second embodiment, allows a stronger ultraviolet light beam to reach the multilayer film parabolic mirror 207. This is due to the cover 125 having a sealed structure, which can have oxygen gas supplied into the interior. Since the oxygen gas does not leak from inside the cover 125 into the vacuum chamber 100, the ultraviolet light from the excimer lamp 112 is not absorbed by oxygen outside the cover 125 in the vacuum chamber 100. The internal pressure within the cover 125 can also be set higher than that of the second and third embodiments, and thereby the carbon-based deposits stuck on the multilayer film parabolic mirror 207 are removed within a shorter period of time.

In the fourth embodiment, the cover 125 has a sealed structure. The cover 125, however, does not have to be completely sealed, and a semi-sealed enclosure is acceptable. For instance, even if a small gap is present between the cover 125 and the multilayer film parabolic mirror 207, oxygen leaking from the cover 125 into the vacuum chamber 100 can be evacuated by the vacuum evacuator 121 if the conductance is small enough. Thus, the oxygen pressure in the vacuum chamber 100 is not raised, and the absorption of the ultraviolet light by oxygen is minimized to a level that practically presents no problems. In other words, it will be acceptable if the cover is substantially enclosed.

Although the embodiment above has been discussed in connection with the removal method of only the deposit on the multilayer film parabolic mirror 207, the carbon-based deposits on the X ray filter 109 and the laser beam input window 103a is similarly removed.

In the fourth embodiment, the topmost layer of the multilayer film parabolic mirror 207 can be made sufficiently thinner than other Si layers. With this arrangement, Si of the sputtered particles gradually deposits on the topmost layer, to the period length of the multilayer film while the reflectance of the mirror also gradually increases. When the deposit of Si exceeds the period length, the reflectance starts decreasing. This structure reduces the drop in reflectance for a longer period of time compared to the case when the Si layer is stacked to the normal period length thickness. If the other material of the multilayer film is free from oxidation, the topmost layer of Si may be entirely removed. This is not limited only to the Mo/Si multilayer film. In other multilayer films, if the sputtered particles deposited on the multilayer film is one of the materials forming the multilayer film, by minimizing the thickness of the topmost layer of the material of the sputtered particles or by totally eliminating the layer, the same effect can be obtained.

Fifth Embodiment

Figure 8:
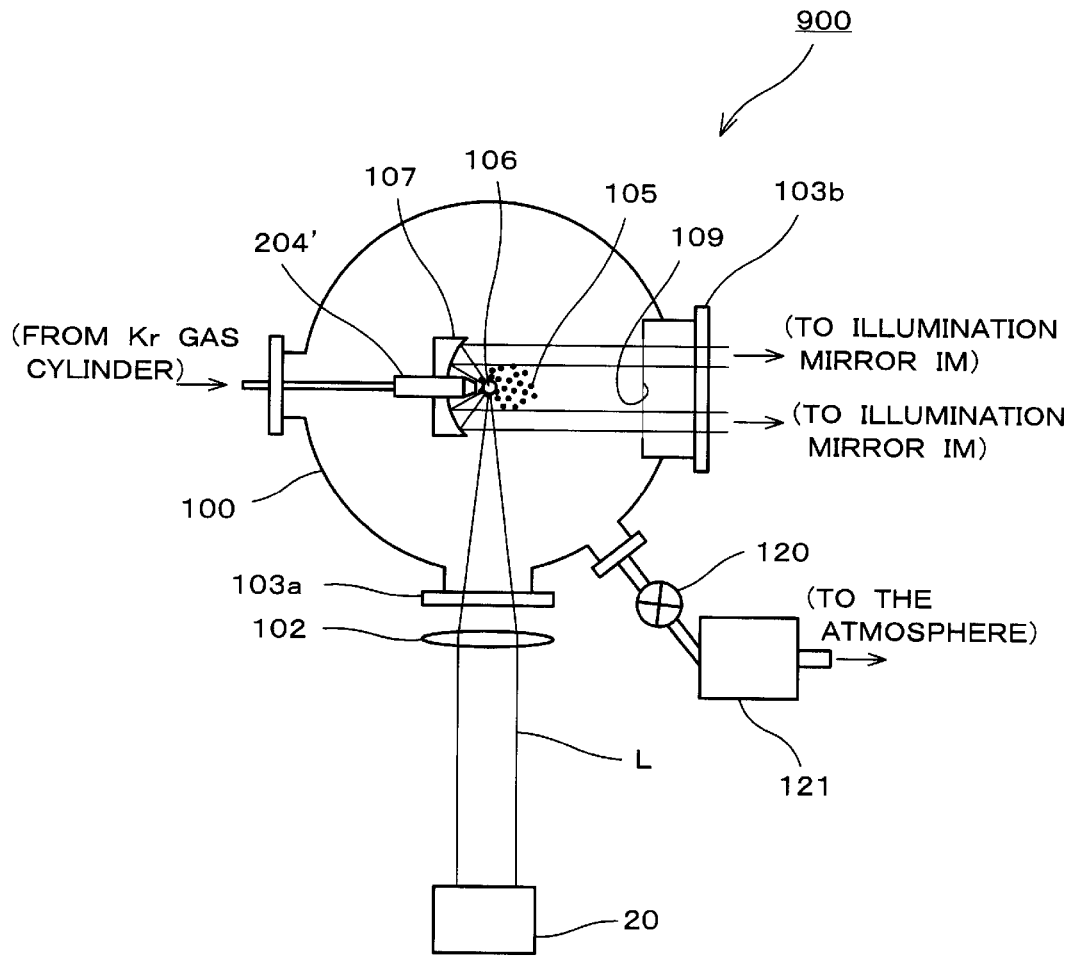
FIG. 8 is diagrammatic view showing a light source in accordance with a fifth embodiment of the present invention.

A fifth embodiment of the present invention is now discussed, referring to FIG. 8. Components identical to those described in connection with the second embodiment are designated with the same reference numerals and the discussion thereabout is briefly made or entirely omitted here.

Like the second embodiment, the fifth embodiment is also identical in structure to the first embodiment except for the structure of the light source (laser-excited plasma light source), and the light source of the fifth embodiment is discussed below.

FIG. 8 shows the general structure of a laser-excited plasma light source 900 of the fifth embodiment. The light source 900 has a simplified structure of the light source 70 of the second embodiment and has a nozzle 204' instead of the nozzle 204.

In the light source 900 of the fifth embodiment, the members related to the ultraviolet irradiations are eliminated, and the heater on the back of the multilayer film parabolic mirror 107 is also eliminated.

Similar to the nozzle 104, the nozzle 204' is a pulse-jet nozzle which releases a krypton gas (Kr gas) as the energy-ray generating material (target) at a back pressure of 50 atmospheres, and the nozzle is opened for about 500 $\mu$s. The distance between the plasma generation position and the tip of the nozzle 204' is 1 mm. Unlike the nozzle 104, the tip of the nozzle 204' and its peripheral portion are formed of quartz ($SiO_2$).

As with the light source 70, the light source 900 generates the plasma 106 by converging the laser beam L at a gaseous target or cluster target (Kr here) released through the nozzle 204'. The EUV light EL generated from the plasma 106 is reflected on the multilayer film parabolic mirror 107, and only the EUV light having the designed wavelength of the multilayer film 107, is transmitted through the X-ray filter 109 and is guided to the later-stage illumination mirror IM.

The nozzle 204' and its peripheral portion are abraded by the fast atoms, ions, and electrons from the plasma, and the sputtered particles are stuck and deposited onto the multilayer film parabolic mirror 107 and the X ray filter 109. Under the impact from fast particles from the plasma, however, most of the sputtered particles released from the nozzle 204' and its peripheral portion are resolved to a scattered state into silicon (Si) and oxygen (O). Of these materials, oxygen becomes oxygen molecules (oxygen gas) before reaching the multilayer film parabolic mirror 107 and the X ray filter 109, and is exhausted from the vacuum chamber through the vacuum evacuator 121.

The remaining silicon (Si) is stuck and deposited onto the optical elements. Since Si is a constituent material of the multilayer film parabolic mirror 107 and the X-ray filter 109, and has an absorption limit of 12.4 nm, it has a high transmittance to the EUV light having the wavelength of 13 nm. This wavelength is the reflected wavelength of the multilayer film parabolic mirror 107. Therefore, if a modest mount of the Si sputtered particles is deposited on the optical elements, the reflectance (or transmittance) is not reduced so much. Accordingly, the light source 900 can continuously operate for a long period of time.

As discussed above, the light source 900 and the scanning type exposure apparatus incorporating the light source 900 of the fifth embodiment has the same advantages as of the second embodiment, and as is obvious comparing FIG. 5 and FIG. 8, the structure of the light source can be simplified. Also, since quartz ($SiO_2$) is easy to process and form, manufacturing the light source 900 becomes easy, compared to manufacturing the nozzle and its peripheral portion formed of only Si.

In the fifth embodiment, quartz is used for the material of the nozzle end portion and its peripheral portion. Ordinary glass is also acceptable (glass contains much of $SiO_2$). The material for the nozzle is not limited to $SiO_2$, and silicon nitride ($Si_3N_4$) may be employed. Similar to $SiO_2$, silicon nitride is a compound of which an element becomes gaseous at normal temperature, so the compound becomes nitrogen gas and exhausted from the vacuum chamber. Also, the material in use is not limited to Si compounds, and zirconium (Zr) compounds, for instance, zirconium oxide ($ZrO_2$) may be employed. Since Zr has a high transmittance to the 13 nm wavelength light, the drop in the reflectance (transmittance) is not much, even if a modest amount of Zr is deposited on the optical elements.

In the second to fifth embodiments, oxygen gas is used as a gas to be introduced into the vacuum chamber or the cover. The gas, however, may be a gas containing oxygen (air, for instance), ozone, or a gas containing ozone. Although the excimer lamp is employed for the ultraviolet light source, a mercury lamp or an excimer laser light source is also acceptable. Since the laser-excited plasma generates not only the EUV light but also the ultraviolet light, the ultraviolet light may be employed as an ultraviolet light source. In this arrangement, there is no need for arranging a separate ultraviolet light source, therefore the can substantially simplify the structure of the apparatus. By simply generating the plasma in the oxygen atmosphere, both supplying the EUV light and removing the carbon-based deposits with the ultraviolet light can be concurrently performed. This arrangement is particularly advantageous in terms of operation ratio because there is no need to stop the operation of the laser-excited plasma light source.

In the second through fifth embodiments, the nozzle is a pulse-jet nozzle. Alternatively, the nozzle may be a continuously discharging nozzle. In the second through fifth embodiments, the Kr gas is employed as a target. Alternatively, the target may be other substance, such as $CO_2$, $N_2$, or Xe.

The exposure apparatus can be made to have one of the light sources 16, 70, 80, 90, and 900, the illumination optical system including a plurality of mirrors, and the projection optical system incorporated in the main body. Optical adjustment is to be performed, as well as assembling the reticle stage, the wafer stage, and the two-dimensional linear actuator, each composed of a number of mechanical parts, into the main body of the exposure apparatus. The wiring and piping are connected, and the control system of the main controller is electrically connected to each component. Finally, general adjustments are performed (including electrical adjustments and operation verification). The making of the exposure apparatus is preferably performed in a clean room, which is controlled in temperature, degree of cleanliness or other parameters.

Each of the embodiments above has been discussed in connection with the gas-jet type, laser-excited plasma light source in which the present invention is implemented. The present invention is, however, not limited to this type of light source. The present invention may be equally applied to the water drop type, as disclosed in U.S. Pat. No. 5,577,091 and U.S. Pat. No. 5,459,771, i.e., the laser-excited plasma light source which employs water or ice as a target, rather than a gas. As long as national laws in designated states or elected states, to which this international application is applied, permit, the disclosure of the above-cited United States Patent is fully incorporated by reference herein, except for the description relating to the materials of the nozzle.

In the above embodiments, the laser-excited plasma light source of this invention is employed as the exposure light source (the illumination light source) for the exposure apparatus. Alternatively, the laser-excited plasma light source of this invention can serve as a light source for microscopes and analyzers.

<<Device Producing Method>>

A device producing method using the above exposure apparatus and method in a lithographic process will be described in detail next.

Figure 9:
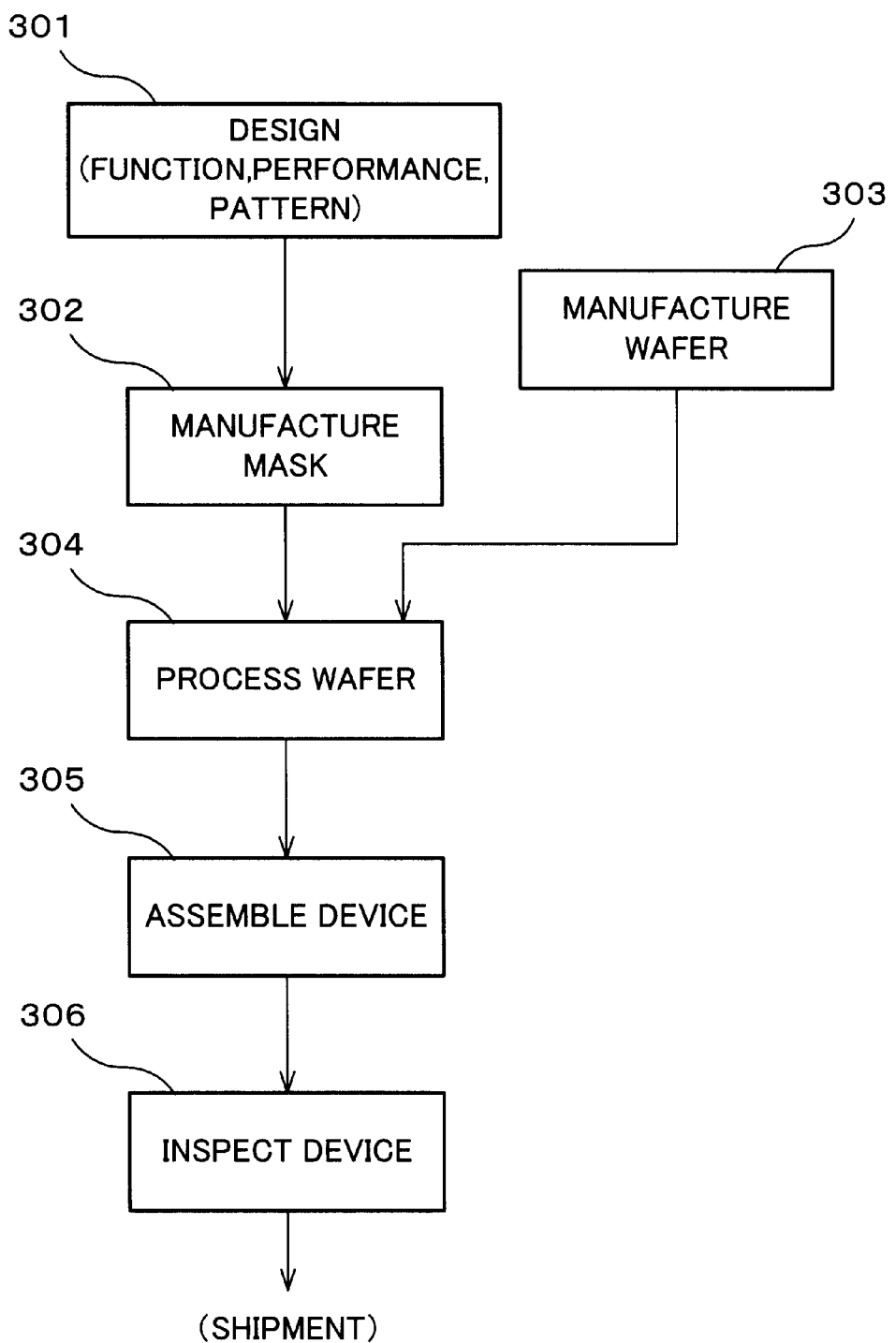
FIG. 9 is a flowchart explaining an embodiment of a device manufacturing method of the present invention.

FIG. 9 is a flow chart showing an example of producing a device (a semiconductor chip such as an IC or LSI, a liquid crystal panel, a CCD, a thin magnetic head, a micromachine, or the like). As shown in FIG. 9, in step 301 (design step), function/performance is designed for a device (e.g., circuit design for a semiconductor device) and a pattern to implement the function is designed. In step 302 (mask producing step), a mask on which the designed circuit pattern is formed is manufactured. In step 303 (wafer producing step), a wafer is producing by using a silicon material or the like.

In step 304 (wafer processing step), an actual circuit and the like are formed on the wafer by lithography or the like using the mask and wafer prepared in steps 301 to 303, as will be described later. In step 305 (device assembly step), a device is assembled by using the wafer processed in step 304. Step 305 includes processes such as dicing, bonding, and packaging (chip encapsulation).

Finally, in step 306 (inspection step), a test on the operation of the device, durability test, and the like are performed. After these steps, the device is completed and shipped out.

Figure 10:
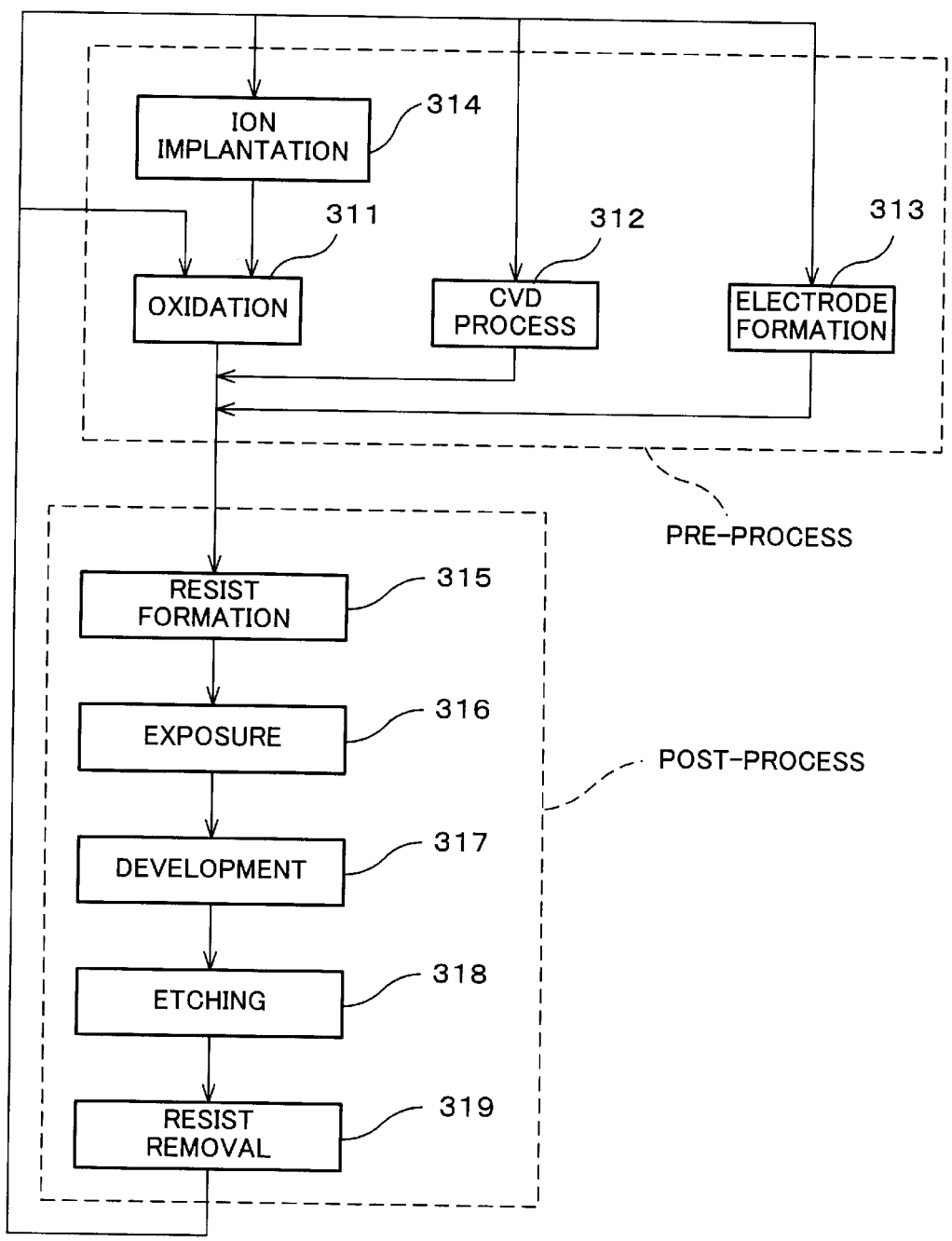
FIG. 10 is a flow chart showing the process in step 304 in FIG. 9.

FIG. 10 is a flow chart showing a detailed example of step 304 described above in producing the semiconductor device. Referring to FIG. 16, in step 311 (oxidation step), the surface of the wafer is oxidized. In step 312 (CVD step), an insulating film is formed on the wafer surface. In step 313 (electrode formation step), an electrode is formed on the wafer by vapor deposition. In step 314 (ion implantation step), ions are implanted into the wafer. Steps 311 to 314 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 315 (resist formation step), the wafer is coated with a photosensitive agent. Next, as in step 316, the circuit pattern on the mask is transcribed onto the wafer by the above exposure apparatus and method. Then, in step 317 (developing step), the exposed wafer is developed. In step 318 (etching step), an exposed member on a portion other than a portion where the resist is left is removed by etching. Finally, in step 319 (resist removing step), the unnecessary resist after the etching is removed.

By repeatedly performing these pre-process and post-process, multiple circuit patterns are formed on the wafer.

And, by using the device manufacturing method of this embodiment, the exposure apparatus in each embodiment can be used in the exposure process (step 316). Therefore, the 13 nm wavelength EUV light can transfer a reticle (mask) pattern onto a wafer, allowing a fine pattern as fine as a device rule of 100 nm to 70 nm to be transferred with a high accuracy. The reduction of the downtime of the apparatus for the maintenance of the collecting mirror improves the operation ratio of the apparatus. Micro-devices having a high degree of integration can thus be manufactured with high productivity.

While the above-described embodiments of the present invention are the presently preferred embodiments thereof, those skilled in the art of lithography systems will readily recognize that numerous additions, modifications and substitutions may be made to the above-described embodiments without departing from the spirit and scope thereof. It is intended that all such modifications, additions and substitutions fall within the scope of the present invention, which is best defined by the claims appended below.

What is claimed is:

1. A laser-excited plasma light source which generates energy beams by irradiating an energy-ray generating material with a laser beam to excite said energy-ray generating material to a plasma state, said light source comprising:
   a vacuum chamber;
   a nozzle which introduces said energy-ray generating material into said vacuum chamber;
   a first irradiation portion which condenses and irradiates said laser beam via a guiding window arranged on said vacuum chamber on said energy-ray generating material introduced by said nozzle;
   an optical element which is arranged within said vacuum chamber and guides said energy beams generated by irradiating said laser beam on said energy-ray generating material out of said vacuum chamber;
   a gas introduction portion which introduces a gas including at least one of oxygen and ozone into said vacuum chamber; and
   a second irradiation portion which irradiates a cleaning light onto said optical element, said second irradiation portion including one of:
      a piercing portion which pierces a side wall of said vacuum chamber and an emitting portion which is located at an internal portion of the side wall of said vacuum chamber, and
      an emitting portion which is located at an external portion of the side wall of said vacuum chamber and a passing section which said cleaning light emitted from said external emitting portion passes through.

2. A laser-excited plasma light source according to claim 1, wherein said second irradiation portion includes a mirror which reflects said cleaning light and guides said cleaning light to said optical element.

3. A laser-excited plasma light source according to claim 1, said light source further comprising:
   an adjustment unit which adjusts pressure of said gas introduced by said gas introduction portion into said vacuum chamber.

4. A laser-excited plasma light source according to claim 3, wherein said adjustment unit includes an exhausting unit that exhausts gas within said vacuum chamber.

5. A laser-excited plasma light source according to claim 1, wherein said second irradiation portion irradiates said cleaning light on said optical element without cutting off said energy beams generated by irradiating said laser beam on said energy-ray generating material, which are guided out of said vacuum chamber by said optical element.

6. A laser-excited plasma light source according to claim 1, said light source further comprising:
   a cover portion which is arranged within said vacuum chamber covering said optical element; wherein
   said gas introduction portion guides said gas into an internal space of said cover portion spatially isolated from an atmosphere within said vacuum chamber by said cover portion, and
   said second irradiation portion irradiates said cleaning light onto said optical element in said internal space.

7. A laser-excited plasma light source that generates energy beams by irradiating an energy-ray generating material with a laser beam to excite said energy-ray generating material to a plasma state, said light source comprising:
   a vacuum chamber;
   a nozzle which introduces said energy-ray generating material into said vacuum chamber;
   a first irradiation portion which condenses and irradiates said laser beam via a guiding window arranged on said vacuum chamber on said energy-ray generating material introduced by said nozzle;
   an optical element which is arranged within said vacuum chamber and guides said energy beams generated by irradiating said laser beam on said energy-ray generating material out of said vacuum chamber;
   a cover portion which is arranged within said vacuum chamber covering said optical element;
   a gas introduction portion which introduces a gas including at least one of oxygen and ozone into an internal space of said cover portion spatially isolated from an atmosphere within said vacuum chamber by said cover portion; and
   a second irradiation portion which irradiates a cleaning light onto said optical element within said internal space.

8. A laser-excited plasma light source according to claim 7, wherein said second irradiation portion includes an emitting portion of said cleaning light arranged within said vacuum chamber.

9. A laser-excited plasma light source according to claim 7, said light source further comprising:
   an adjustment unit which adjusts pressure of said gas introduced by said gas introduction portion into said vacuum chamber.

10. A laser-excited plasma light source according to claim 9, wherein said adjustment unit includes an exhausting unit that exhausts gas within said vacuum chamber.

11. An exposure apparatus which comprises a laser-excited plasma light source for generating energy beams by irradiating an energy-ray generating material with a laser beam to excite said energy-ray generating material to a plasma state, wherein said light source includes:
   a vacuum chamber;
   a nozzle which introduces said energy-ray generating material into said vacuum chamber;
   a first irradiation portion which condenses and irradiates said laser beam via a guiding window arranged on said vacuum chamber on said energy-ray generating material introduced by said nozzle;
   an optical element which is arranged within said vacuum chamber and guides said energy beams generated by irradiating said laser beam on said energy-ray generating material out of said vacuum chamber;
   a gas introduction portion which introduces a gas including at least one of oxygen and ozone into said vacuum chamber; and
   a second irradiation portion which irradiates a cleaning light onto said optical element, said second irradiation portion including one of:
      a piercing portion which pierces a side wall of said vacuum chamber and an emitting portion which is located at an internal portion of the side wall of said vacuum chamber, and
      an emitting portion which is located at an external portion of the side wall of said vacuum chamber and a passing section which said cleaning light emitted from said external emitting portion passes through.

12. An exposure apparatus according to claim 11, said exposure apparatus further comprising:
an adjustment unit which adjusts pressure of said gas introduced by said gas introduction portion into said vacuum chamber.

13. An exposure apparatus according to claim 11, wherein said second irradiation portion irradiates said cleaning light on said optical element without cutting off said energy beams generated by irradiating said laser beam on said energy-ray generating material, which are guided out of said vacuum chamber by said optical element.

14. An exposure apparatus according to claim 11, said exposure apparatus further comprising:
a cover portion which is arranged within said vacuum chamber covering said optical element; wherein
said gas introduction portion guides said gas into an internal space of said cover portion spatially isolated from an atmosphere within said vacuum chamber by said cover portion, and
said second irradiation portion irradiates said cleaning light onto said optical element in said internal space.

15. An exposure apparatus which comprises a laser-excited plasma light source for generating energy beams by irradiating an energy-ray generating material with a laser beam to excite said energy-ray generating material to a plasma state, wherein said light source includes:
a vacuum chamber;
a nozzle which introduces said energy-ray generating material into said vacuum chamber;
a first irradiation portion which condenses and irradiates said laser beam via a guiding window arranged on said vacuum chamber on said energy-ray generating material introduced by said nozzle;
an optical element which is arranged within said vacuum chamber and guides said energy beams generated by irradiating said laser beam on said energy-ray generating material out of said vacuum chamber;
a cover portion which is arranged within said vacuum chamber covering said optical element;
a gas introduction portion which introduces a gas including at least one of oxygen and ozone into an internal space of said cover portion spatially isolated from an atmosphere within said vacuum chamber by said cover portion; and
a second irradiation portion which irradiates a cleaning light onto said optical element within said internal space.

16. An exposure apparatus according to claim 15, wherein said second irradiation portion includes an emitting portion of said cleaning light arranged within said vacuum chamber.

17. An exposure apparatus according to claim 15, said exposure apparatus further comprising:
an adjustment unit which adjusts pressure of said gas introduced by said gas introduction portion into said vacuum chamber.

18. A making method of a laser-excited plasma light source which generates energy beams by irradiating an energy-ray generating material with a laser beam to excite said energy-ray generating material to a plasma state, said method including steps of:
providing a vacuum chamber;
providing a nozzle which introduces said energy-ray generating material into said vacuum chamber;
providing a first irradiation portion which condenses and irradiates said laser beam via a guiding window arranged on said vacuum chamber on said energy-ray generating material introduced by said nozzle;
providing an optical element arranged within said vacuum chamber which guides said energy beams generated by irradiating said laser beam on said energy-ray generating material out of said vacuum chamber;
providing a gas introduction portion which introduces a gas including at least one of oxygen and ozone into said vacuum chamber; and
providing a second irradiation portion which irradiates a cleaning light onto said optical element, and includes one of:
a piercing portion which pierces a side wall of said vacuum chamber and an emitting portion which is located at an internal portion of the side wall of said vacuum chamber, and
an emitting portion which is located at an external portion of the side wall of said vacuum chamber and a passing section which said cleaning light emitted from said external emitting portion passes through.

19. A making method according to claim 18, wherein said step of providing a second irradiation portion includes a step of providing a mirror which reflects said cleaning light and guides said cleaning light to said optical element.

20. A making method according to claim 18, said method further including a step of providing an adjustment unit which adjusts pressure of said gas introduced by said gas introduction portion into said vacuum chamber.

21. A making method according to claim 20, wherein said step of providing an adjustment unit includes a step of providing an exhausting unit that exhausts gas within said vacuum chamber.

22. A making method according to claim 18, wherein said second irradiation portion is provided in said step of providing a second irradiation portion to make irradiation of said cleaning light possible on said optical element without cutting off said energy beams generated by irradiating said laser beam on said energy-ray generating material, which are guided out of said vacuum chamber by said optical element.

23. A making method according to claim 18, said method further including a step of providing a cover portion which is arranged within said vacuum chamber covering said optical element; wherein
said gas introduction portion is provided in said step of providing a gas introduction portion to make guidance of said gas into an internal space of said cover portion spatially isolated from an atmosphere within said vacuum chamber by said cover portion possible, and
said second irradiation portion is provided in said step of providing a second irradiation portion to make irradiation of said cleaning light possible onto said optical element in said internal space.

24. A making method of an exposure apparatus, said method including a step of providing a laser-excited plasma light source made by a making method according to claim 18 as a light source for exposure.

25. A making method of a laser-excited plasma light source which generates energy beams by irradiating an energy-ray generating material with a laser beam to excite said energy-ray generating material to a plasma state, said method including steps of:
providing a vacuum chamber;
providing a nozzle which introduces said energy-ray generating material into said vacuum chamber;

providing a first irradiation portion which condenses and irradiates said laser beam via a guiding window arranged on said vacuum chamber on said energy-ray generating material introduced by said nozzle;

providing an optical element arranged within said vacuum chamber which guides said energy beams generated by irradiating said laser beam on said energy-ray generating material out of said vacuum chamber;

providing a cover portion which covers said optical element within said vacuum chamber;

providing a gas introduction portion which introduces a gas including at least one of oxygen and ozone into an internal space of said cover portion spatially isolated from an atmosphere within said vacuum chamber by said cover portion; and providing a second irradiation portion which irradiates a cleaning light onto said optical element within said internal space.

26. A making method according to claim 25, wherein an emitting portion of said cleaning light is arranged within said vacuum chamber in said step of providing said second irradiation portion.

27. A making method according to claim 25, said method further including a step of providing an adjustment unit which adjusts pressure of said gas introduced by said gas introduction portion into said vacuum chamber.

28. A making method according to claim 27, wherein said step of providing an adjustment unit includes a step of providing an exhausting unit that exhausts gas within said vacuum chamber.

29. A making method of an exposure apparatus, said method including a step of providing a laser-excited plasma light source made by a making method according to claim 25 as a light source for exposure.

* * * * *